United States Patent
Tanaka et al.

(10) Patent No.: US 7,759,181 B2
(45) Date of Patent: Jul. 20, 2010

(54) METHOD OF MANUFACTURING A SEMICONDUCTOR DEVICE

(75) Inventors: Koichiro Tanaka, Kanagawa (JP); Setsuo Nakajima, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 404 days.

(21) Appl. No.: 11/154,846

(22) Filed: Jun. 16, 2005

(65) Prior Publication Data

US 2005/0233512 A1   Oct. 20, 2005

Related U.S. Application Data

(62) Division of application No. 10/034,022, filed on Dec. 20, 2001, now Pat. No. 6,955,956.

(30) Foreign Application Priority Data

Dec. 26, 2000   (JP) .............................. 2000-396315

(51) Int. Cl.
*H01L 21/84* (2006.01)
(52) U.S. Cl. ................................ 438/166; 257/E21.561
(58) Field of Classification Search ......... 438/151–166; 257/E21.561
See application file for complete search history.

(56) References Cited

U.S. PATENT DOCUMENTS

| | | | |
|---|---|---|---|
| 4,084,883 A * | 4/1978 | Eastman et al. ............. | 359/487 |
| 4,713,518 A | 12/1987 | Yamazaki et al. ........... | 219/121 |
| 4,749,364 A | 6/1988 | Arney et al. ................ | 439/372 |
| 4,874,920 A | 10/1989 | Yamazaki et al. ...... | 219/121.85 |

(Continued)

FOREIGN PATENT DOCUMENTS

CN   1003899 B   4/1989

(Continued)

OTHER PUBLICATIONS

U.S. Appl. No. 09/818,502 (pending) to Yamazaki et al, filed Mar. 28, 2001, including specification, claims, abstract, drawings, and PTO filing receipt.

*Primary Examiner*—Richard A. Booth
(74) *Attorney, Agent, or Firm*—Husch Blackwell Sanders LLP

(57) ABSTRACT

In a laser irradiation apparatus having low running costs as compared with a conventional apparatus and a laser beam irradiation method using the same, a crystalline semiconductor film having a crystal grain of a grain size equivalent to or larger than a conventional one is formed, and a TFT is manufactured by using the crystalline semiconductor film, so that the TFT enabling a high speed operation is realized. In a case where a laser beam of a short output time from a solid laser as a light source is irradiated to a semiconductor film, another laser beam is delayed from one laser beam, and the laser beams are synthesized to be irradiated to the semiconductor film, so that a cooling speed of the semiconductor film is made gentle, and it becomes possible to form the crystalline semiconductor film having the crystal grain of the grain size equivalent to or larger than that in a case where a laser beam having a long output time is irradiated to the semiconductor film. By manufacturing a TFT using such a crystalline semiconductor film, the TFT enabling the high speed operation can be realized.

43 Claims, 27 Drawing Sheets

U.S. PATENT DOCUMENTS

| | | | |
|---|---|---|---|
| 4,970,368 A | 11/1990 | Yamazaki et al. | 219/121.85 |
| 4,970,369 A | 11/1990 | Yamazaki et al. | 219/121.85 |
| 5,365,080 A | 11/1994 | Yamazaki et al. | 257/66 |
| 5,561,081 A * | 10/1996 | Takenouchi et al. | 438/166 |
| 5,631,736 A | 5/1997 | Thiel et al. | |
| 5,706,094 A | 1/1998 | Maris | |
| 5,795,795 A | 8/1998 | Kousai et al. | 437/174 |
| 5,815,494 A | 9/1998 | Yamazaki et al. | 372/25 |
| 5,854,803 A | 12/1998 | Yamazaki et al. | 372/31 |
| 5,893,990 A | 4/1999 | Tanaka | 219/121.8 |
| 5,900,980 A | 5/1999 | Yamazaki et al. | 359/619 |
| 5,959,779 A | 9/1999 | Yamazaki et al. | 359/624 |
| 6,002,523 A | 12/1999 | Tanaka | 359/624 |
| 6,084,897 A * | 7/2000 | Wakabayashi et al. | 372/38.02 |
| 6,104,535 A | 8/2000 | Tanaka | 359/619 |
| 6,137,633 A | 10/2000 | Tanaka | 359/619 |
| 6,160,827 A | 12/2000 | Tanaka | 372/24 |
| 6,172,820 B1 | 1/2001 | Kuwahara | |
| 6,176,926 B1 | 1/2001 | Tanaka | 117/92 |
| 6,246,524 B1 | 6/2001 | Tanaka | 359/619 |
| 6,249,381 B1 | 6/2001 | Suganuma | |
| 6,304,385 B1 | 10/2001 | Tanaka | |
| 6,621,636 B2 | 9/2003 | Tanaka et al. | |
| 2001/0005606 A1 * | 6/2001 | Tanaka et al. | 438/151 |
| 2001/0043321 A1 | 11/2001 | Nishi et al. | |
| 2002/0027716 A1 | 3/2002 | Tanaka | |
| 2003/0032222 A1 | 2/2003 | Okumura | 438/166 |
| 2003/0117601 A1 | 6/2003 | Kudo | 355/53 |

FOREIGN PATENT DOCUMENTS

| | | |
|---|---|---|
| JP | 5-31354 | 2/1993 |
| JP | 10-256178 | 2/1993 |
| JP | 06-005537 | 1/1994 |
| JP | 6-291038 | 10/1994 |
| JP | 7-240415 | 9/1995 |
| JP | 10-125614 | 5/1998 |
| JP | 2000-021776 | 1/2000 |
| JP | 2000-11747 | 4/2000 |

* cited by examiner

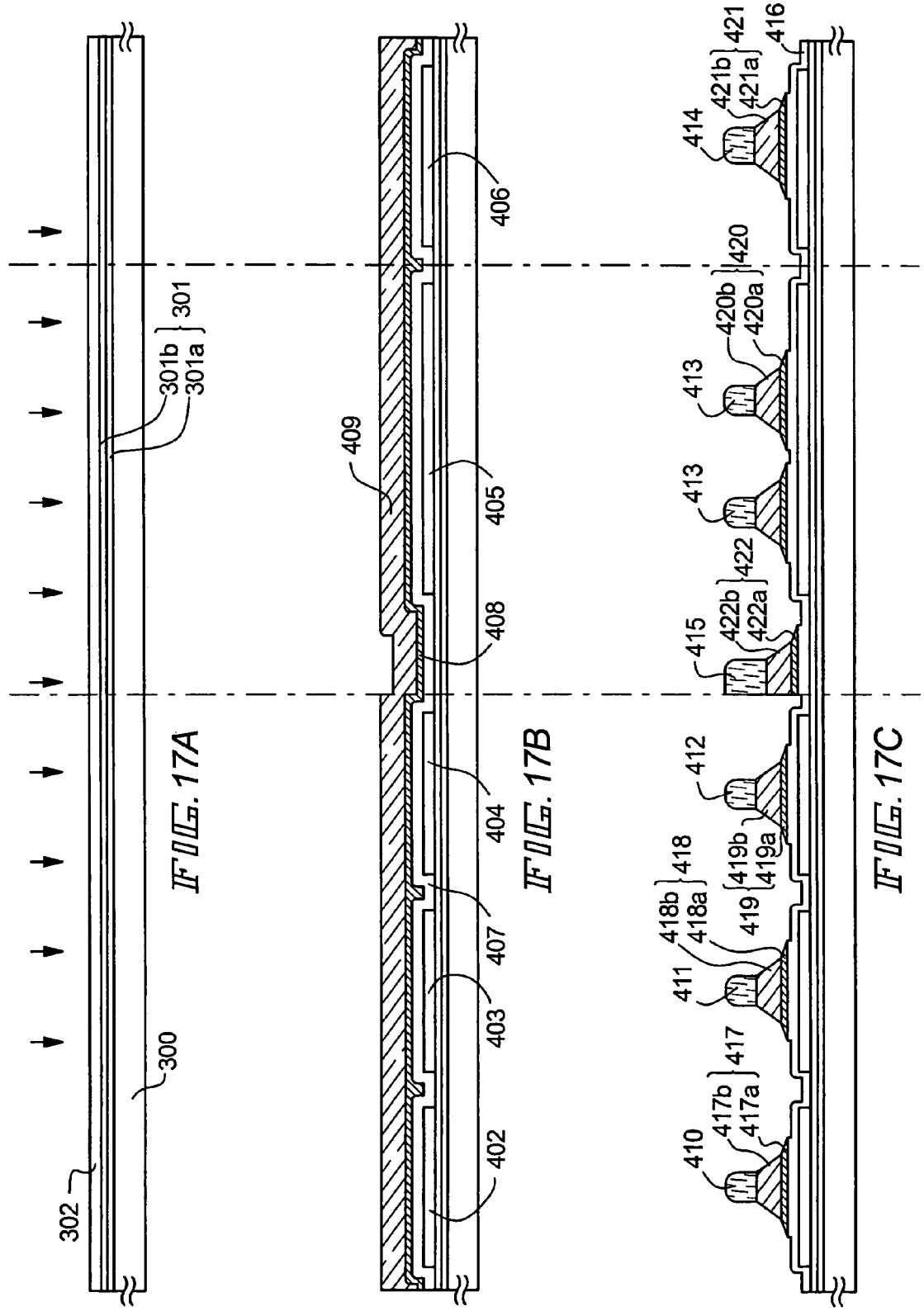

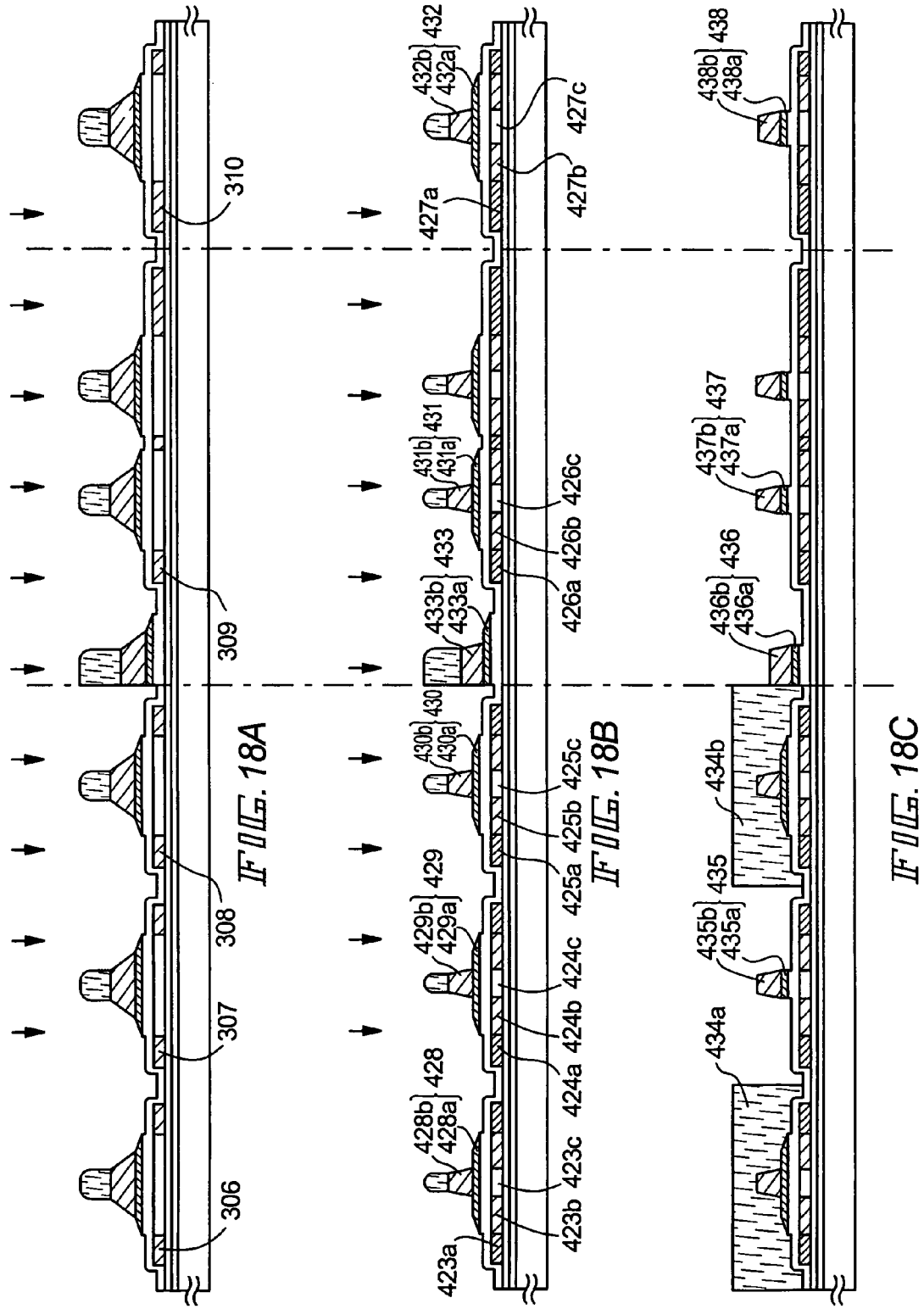

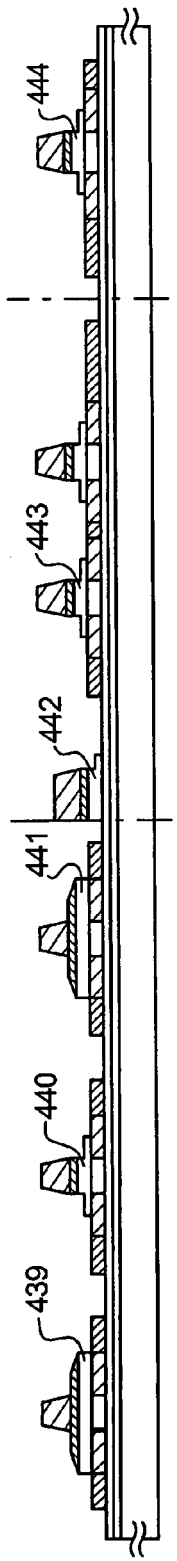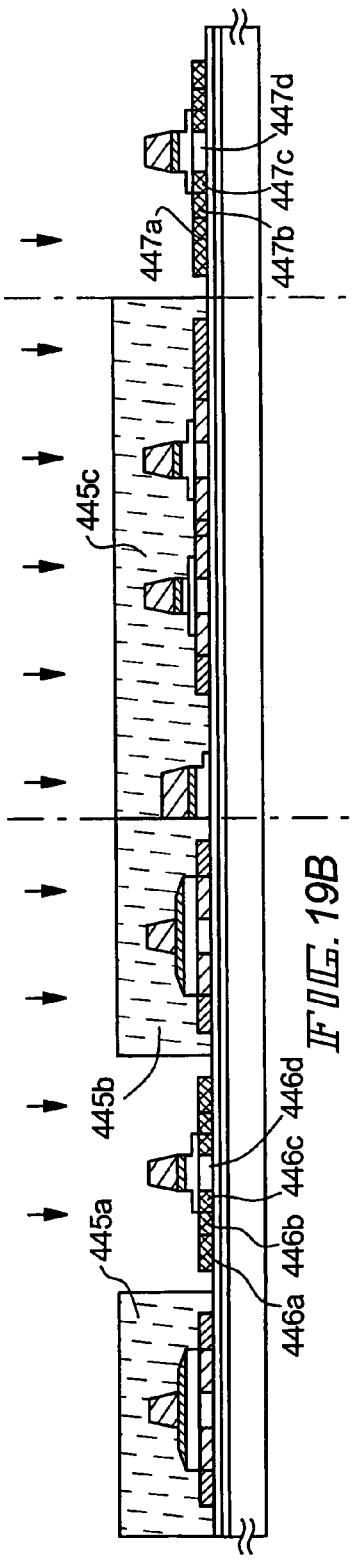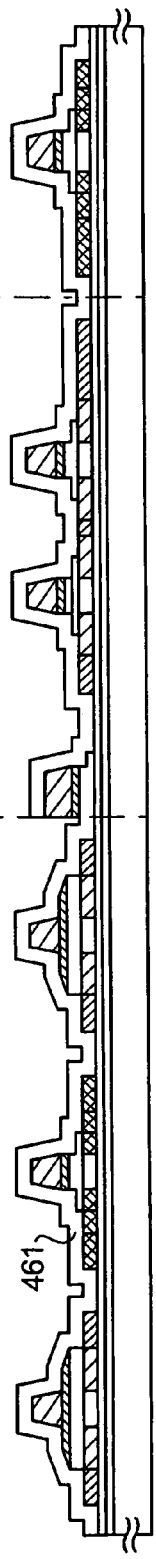

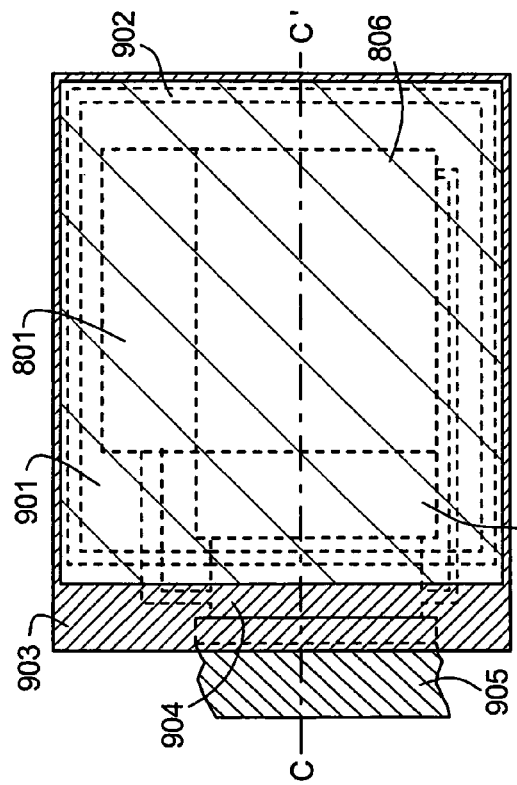
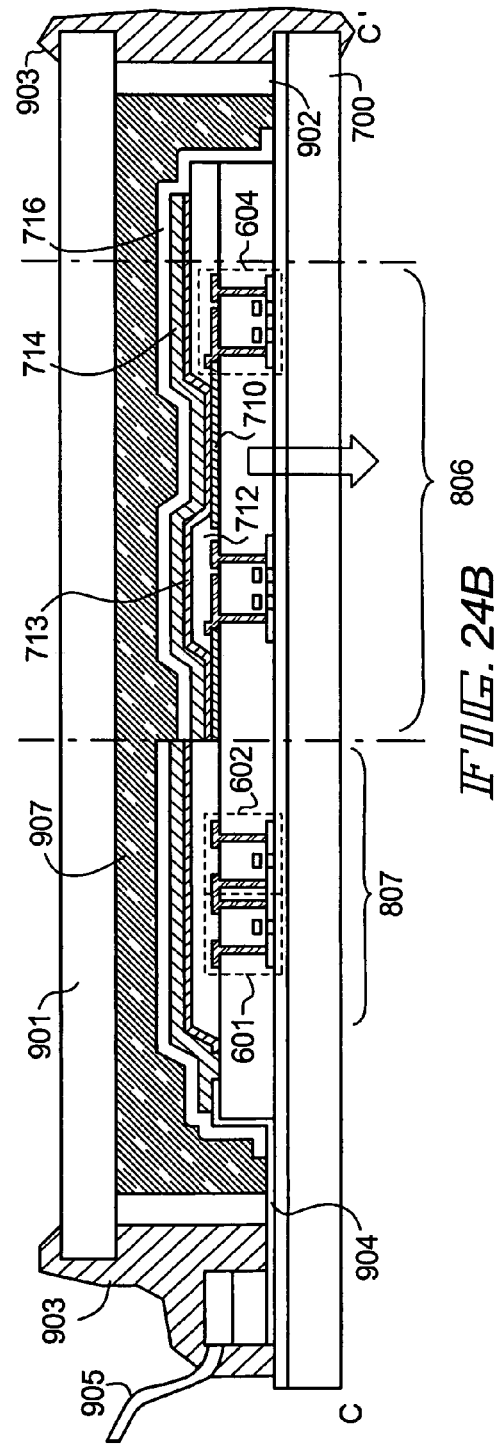
FIG. 24A
FIG. 24B

METHOD OF MANUFACTURING A SEMICONDUCTOR DEVICE

This application is a divisional of U.S. application Ser. No. 10/034,022 filed on Dec. 20, 2001 now U.S. Pat. No. 6,955,956.

BACKGROUND OF THE INVENTION

1. Field of the Invention

The present invention relates to a method of manufacturing a semiconductor device, which includes a step of annealing a semiconductor film by using a laser beam. Incidentally, the semiconductor device here indicates any devices capable of functioning by using semiconductor characteristics, and also includes an electro-optic device, such as a liquid crystal display device or a light-emitting device, and an electronic device including the electro-optic device as a part thereof.

2. Description of the Related Art

In recent years, a technique is widely studied in which a laser annealing is performed on a semiconductor film formed on an insulating substrate of glass or the like to crystallize the film or to improve its crystallinity. Silicon is often used for the semiconductor film.

As compared with a synthetic quartz glass substrate which is conventionally often used, the glass substrate has merits that it is inexpensive and is rich in workability, and a large area substrate can be easily manufactured. This is the reason why the study is carried out. The reason why the laser is used for crystallization by preference is that the melting point of the glass substrate is low. The laser can give high energy only to the semiconductor film without raising the temperature of the substrate very much. Besides, as compared with heating means using an electrothermal furnace, its throughput is remarkably high.

Since a crystalline semiconductor is composed of a number of crystal grains, it is also called a polycrystalline semiconductor film. Since a crystalline semiconductor film formed through the laser annealing has a high mobility, a thin film transistor (TFT) is formed by using this crystalline semiconductor film, and it is extensively used for, for example, a monolithic type liquid crystal electro-optic device in which TFTs for a pixel portion and a driving circuit are formed on one glass substrate.

Besides, a method is used by preference in which a laser annealing is performed by forming a laser beam oscillated from a pulse oscillator with a high output such as an excimer laser into a square spot of several cm square or a line with a length of 10 cm or more on an irradiated surface by an optical system and by scanning the laser beam (or by moving the irradiation position of the laser beam relatively to the surface to be irradiated), since the method has high productivity and is industrially superior.

Especially, when a linear beam is used, differently from the case where a spot-like laser beam requiring horizontal and vertical scanning is used, since laser irradiation on the whole surface to be irradiated can be performed by only scanning in the direction normal to the longitudinal direction of the linear beam, the productivity is high. The scanning is performed in the direction normal to the longitudinal direction since it is the most efficient scanning direction. By this high productivity, in the laser annealing method at present, to use the linear beam obtained by forming a pulse oscillation excimer laser beam through a suitable optical system has become the main stream of manufacturing technique of a liquid crystal display device using TFTs.

Here, crystallization of a semiconductor film after irradiation of a laser beam to the semiconductor film will be described. When the laser beam is irradiated to the semiconductor film, the semiconductor is melted. However, as a time elapses, the temperature of the semiconductor film is lowered, and crystal nuclei are created. In the semiconductor film, a limitless number of uniform (or irregular) crystal nuclei are created and grow, so that crystallization is ended. The positions and sizes of crystal grains obtained in this case are random. As compared with the inside of the crystal grain, at the interface of the crystal grain (crystal grain boundary), there are countless recombination centers and trapping centers resulting from amorphous structure, crystal defects and the like. It is known that if a carrier is trapped by the trapping center, the potential of the crystal grain boundary is raised and becomes a barrier against the carrier, so that the current transport characteristic of the carrier is lowered. Especially although the crystallinity of a semiconductor film of a channel formation region exerts a great influence on the electrical characteristics of a TFT, it has been almost impossible to remove the influence of the crystal grain boundary and to form the channel formation region by a single crystal semiconductor film.

Besides, it is known that the growth distance of the crystal grain is proportional to the product of a crystallization time and a growth speed. Here, the crystallization time is a time, as shown in FIG. 28, from (B) the creation of crystal nuclei in a semiconductor film to (C) the end of crystallization of the semiconductor film. When a time from (A) the start of melting the semiconductor film to (C) the end of the crystallization is called a melting time, if the melting time is prolonged and the cooling speed of the semiconductor film is made slow, the crystallization time becomes long, and a crystal grain of a large grain size can be formed.

Although there are various kinds of laser beams, crystallization using a laser beam from a pulse oscillation type excimer laser as a light source (hereinafter referred to as an excimer laser beam) is generally used. The excimer laser has merits that its output is high, and repetitive irradiation at a high frequency is possible, and further, the excimer laser beam has a merit that an absorption coefficient to a silicon film is high.

In order to form the excimer laser beam, KrF (wavelength of 248 nm) or XeCl (wavelength of 308 nm) is used as an exited gas. However, there is a problem that a gas such as Kr (krypton) or Xe (xenon) is very expensive, and when the frequency of a gas exchange becomes high, manufacturing costs are increased.

Besides, the exchange of additional instruments, such as a laser tube for laser oscillation and a gas purifier for removing unnecessary compounds produced in an oscillation process, becomes necessary once in two to three years. Most of these additional instruments are expensive, and there is a problem that the manufacturing costs are increased as well.

As described above, although the laser irradiation apparatus using the excimer laser beam has undoubtedly high performance, it takes much time and labor in maintenance, and the apparatus has also a defect that running costs (here, costs caused from working) are high for a laser irradiation apparatus for production.

Then, in order to realize a laser irradiation apparatus having low running costs as compared with the excimer laser and to realize a laser annealing method using the same, there is a method using a solid laser (a laser using a crystal rod as an oscillation cavity and for outputting a laser beam).

It is conceivable that the reason is that although the solid laser at present has a large output, an output time is very short.

An excitation method of the solid laser includes LD (Laser Diode) excitation, flash lamp excitation, and the like. In order to obtain a large output by the LD excitation, it is necessary to make a large current flow to the LD. Thus, the lifetime of the LD becomes short, and eventually, the cost becomes high as compared with the flash lamp excitation. By such reason, almost all solid lasers by the LD excitation are small output apparatuses, and it is under development as a high output laser for industry at present. On the other hand, since a flash lamp can output extremely intense light, the laser excited by the flash lamp has a high output. However, in the oscillation by the flash lamp excitation, electrons excited by the instantaneously applied energy are emitted at one time, and an output time of the laser becomes very short. Like this, although the solid laser at present has a high output, the output time is very short. Thus, it is difficult to realize formation of a crystal grain, which has a grain size equivalent to or larger than a grain size formed by laser crystallization using the excimer laser, by laser crystallization using the solid laser. Incidentally, in the present specification, the output time is a half value width in one pulse.

Here, crystallization of a semiconductor film was performed by using a YAG laser as one of typical solid lasers. The YAG laser by the flash lamp excitation was used, and after modulation to the second harmonic by a nonlinear optical element, a silicon film was irradiated. The grain size of a crystal grain formed by the laser annealing using the YAG laser was very small as compared with the crystal grain formed by using the excimer laser. When a TFT is manufactured by using a crystalline semiconductor film having such a crystal grain, a large number of crystal grain boundaries exist in a channel formation region having an important influence on the electrical characteristics of the TFT, which cause the electrical characteristics to be lowered. It is conceivable that the reason why only the small crystal grain is formed by the laser annealing using the solid laser is that, as already described, although the solid laser at present has a high output, the output time is very short.

SUMMARY OF THE INVENTION

Therefore, in a laser irradiation apparatus having low running costs as compared with a conventional apparatus and in a laser annealing method using the same, an object of the present invention is to provide a method of manufacturing a semiconductor device by using the laser annealing method for forming a crystal grain having a grain size equivalent to or larger than a conventional one.

Since the object of the invention is to form a crystal grain having a grain size equivalent to or larger than a grain size formed by a laser annealing using an excimer laser, a temperature change when an excimer laser beam was irradiated to a semiconductor film was first calculated. The excimer laser beam was irradiated to a silicon film having a structure shown in FIG. 3, and the temperature with respect to the time was calculated at points A to C of FIG. 3. Here, the output time of the laser beam was made 27 ns, and the energy density was made 0.1 to 0.5 J. The results are shown in FIGS. 7A to 7G. From FIGS. 7A to 7G, it is understood that as the energy density becomes high, the crystallization time and the melting time become long, and the cooling speed becomes gentle. Besides, it is understood that the temperature of the point C follows the temperature change of the point A.

It is possible to point out that in order to form a crystal grain of a large grain size, to make the cooling speed of a semiconductor film gentle is one of effective means. Specifically, there is a method in which an output time of a laser beam is made long and a melting time of a semiconductor film is made long.

Then, the output time of the YAG laser was prolonged, and calculation was made on the temperature change when the semiconductor film was irradiated. As shown in FIG. 3, the laser beam of the YAG laser was irradiated to the silicon film formed on a silicon oxide film and having a thickness of 50 nm, and the temperature relative to the time was calculated at the surface of the silicon film (point A), the interface between the silicon film and the silicon oxide film (point B), and the silicon oxide film 100 nm below the interface (point C). Here, the temperature at which the silicon film was melted was made 1200 K. The results are shown in FIGS. 4A to 6F. In FIGS. 4A to 4D, the output time was made 6.7 ns, and the energy density was made 0.15 to 0.4 J. In FIGS. 4E to 4H, the output time was made 20 ns, and the energy density was made 0.2 to 0.5 J. In FIGS. 5A to 5D, the output time was made 27 ns, and in FIGS. 5E to 5H, the output time was made 50 ns and the energy density was made 0.2 to 0.5 J. In FIGS. 6A to 6C, the output time was made 100 ns, and the energy density was made 0.3 to 0.5 J. In FIGS. 6D to 6F, the output time was made 200 ns, and the energy density, was made 0.4 to 0.6 J.

By the irradiation of the laser beam, the temperature at each of the points A to C is raised, and after a first constant temperature is kept, it is further raised to reach the highest temperature. Then, the temperature at each of the points A to C is lowered, and a second constant temperature is kept, and there is seen a tendency that the temperature is further lowered. Since the calculation is made under the assumption that the melting temperature of the silicon film is 1200 K, the silicon film is melted at the first constant temperature, and solidification (crystallization) of the silicon film occurs at the second constant temperature. Here, a time from the start time of the second constant temperature to the end time thereof corresponds to the crystallization time. It is shown that the longer the crystallization time is, the gentler the cooling speed is. When a time from the start time of the first constant temperature to the end time of the second constant temperature is made a melting time of the silicon film, at the same energy density, the longer the output time is, the gentler the time to the highest temperature reached at each of the points A to C is, and the melting time becomes long. That is, it can be said that the longer the output time is, the gentler the cooling speed of the semiconductor film is.

FIG. 12 shows the temperature of the silicon oxide film at the start time of the crystallization with respect to the output time of the laser beam. From FIG. 12, as the output time becomes long, the temperature of the silicon oxide film at the start time of the crystallization is raised. When the output time of the laser beam is 50 ns or less, the temperature of the silicon oxide film is sharply lowered. That is, it is understood that it is also effective to keep the temperature of the under film high in order to extend the melting time of the semiconductor film.

From the above, as the output time becomes long, the crystallization time and the melting time become long, and the cooling speed of the semiconductor film becomes gentle. Thus, since the creation density of crystal nuclei becomes low and the crystallization time becomes long, a crystal grain of a large grain size can be formed. That is, it can be said that to prolong the output time is effective means for increasing the grain size of the crystal grain.

However, as already described, although the solid laser at present has a large output, the output time is very short. For example, while the output time of the L4308 type XeCl excimer laser (wavelength of 308 nm) made by Lambda Physic Inc. is 27 ns, the output time of the DCR-3D type Nd:YAG laser (wavelength of 532 nm) made by Spectra-Physics Inc. is 5 to 7 ns.

Then, the present invention provides a method of manufacturing a semiconductor device including, as a step, a laser annealing method in which in a case where a laser beam having a short output time from a solid laser (a laser using a crystal rod as an oscillation cavity to output a laser beam) is irradiated to a semiconductor film, another laser beam is delayed from one laser beam and is irradiated to the semiconductor film, so that a cooling speed of the semiconductor film is made gentle, and a crystal grain of a grain size equivalent to or larger than a case where a laser beam having a long output time is irradiated to the semiconductor film is formed.

At this time, it is desirable that the laser beam is formed into a linear shape by an optical system and is irradiated. Incidentally, to form the laser beam into the linear shape means that the laser beam is formed so that the shape on an irradiation surface becomes linear. That is, it means to form the sectional shape of the laser beam into the linear shape. Besides, the "linear shape" here does not mean a "line" in strict meaning, but a rectangle (or a long ellipse) having a large aspect ratio. For example, it indicates one having an aspect ratio of 10 or more (preferably 100 to 10000).

As the solid laser, what is generally known can be used, and a YAG laser (normally indicating Nd:YAG laser), a $YVO_4$ laser, a YLF laser, a $YAlO_3$ laser, a glass laser, a ruby laser, an alexandrite laser, Ti:sapphire laser or the like can be used. Especially, the $YVO_4$ laser or the YAG laser excellent in coherency and pulse energy is preferable.

However, since the primary wave (first harmonic) of the YAG laser has a long wavelength of 1064 nm, it is preferable to use the second harmonic (wavelength of 532 nm), the third harmonic (wavelength of 355 nm) or the fourth harmonic (wavelength of 266 nm). These harmonics can be obtained by using a nonlinear crystal.

The first harmonic can be modulated to the second harmonic, the third harmonic, or the fourth harmonic by a wavelength modulator including a nonlinear element. The respective harmonics may be formed in accordance with a well-known technique. Besides, in the present specification, "a laser beam using a solid laser as a light source" includes not only the first harmonic but also the second harmonic, the third harmonic and the fourth harmonic, the wavelength of which is demodulated halfway.

Besides, a Q switch method (Q modulation switch system) often used in the YAG laser may be used. This is a method in which a Q value is sharply raised from a state where the Q value of a laser oscillator is made sufficiently low so that a steep pulse laser having a very high energy value is outputted. This is a well-known technique.

In the solid laser used in the present invention, since a laser beam can be basically outputted if a solid crystal, a resonant mirror, and a light source for exciting the solid crystal exist, it does not take much time and labor of maintenance as in the excimer laser. That is, since the running costs are very low as compared with the excimer laser, it becomes possible to greatly reduce the manufacturing costs of a semiconductor device. Besides, if the number of acts of maintenance is reduced, the working rate of a production line is also raised, so that the whole throughput of a manufacturing process is improved, and this greatly contributes to the lowering of the manufacturing costs of the semiconductor device. Further, since an occupied area of the solid laser is small as compared with the excimer laser, it is advantageous in design of a manufacturing line.

According to the present invention, in the laser annealing using a laser beam having a short output time, a plurality of laser beams are irradiated while a time difference is provided between them, so that a cooling speed of a semiconductor film is made gentle, and a time allowed for crystal growth is prolonged in a process of crystallization, and eventually, enlargement of a grain size of a crystal grain is realized.

By obtaining a crystalline semiconductor film having a large crystal grain size, it becomes possible to greatly improve the performance of the semiconductor device. For example, with respect to a TFT as an example, when the crystal grain size becomes large, the number of crystal grain boundaries contained in a channel formation region can be decreased. That is, it also becomes possible to manufacture such a TFT that the channel formation region includes one crystal grain boundary, preferably no crystal grain boundary. Besides, since each crystal grain has crystallinity substantially regarded as single crystal, it is also possible to obtain a high mobility (field effect mobility) equivalent to or higher than a transistor using a single crystal semiconductor.

Further, since it is possible to extremely decrease the number of times when a carrier crosses the crystal grain boundaries, it also becomes possible to reduce fluctuation in an on current value (value of drain current flowing when a TFT is in an on state), an off current value (value of drain current flowing when a TFT is in an off state), a threshold voltage, an S value, and a field effect mobility.

BRIEF DESCRIPTION OF THE DRAWINGS

FIGS. 17A to 17C are sectional views showing manufacturing steps of a pixel TFT and TFTs of a driving circuit.

FIGS. 18A to 18C are sectional views showing manufacturing steps of the pixel TFT and the TFTs of the driving circuit.

FIGS. 19A and 19C are sectional views showing manufacturing steps of the pixel TFT and the TFTs of the driving circuit.

FIG. 24A is a top view of a light-emitting device.

FIG. 24B is a sectional structural view of a driving circuit and a pixel portion of the light-emitting device.

DETAILED DESCRIPTION OF THE PREFERRED EMBODIMENTS

Embodiment Mode 1

An embodiment mode for carrying out the invention will be described.

Figure 1:
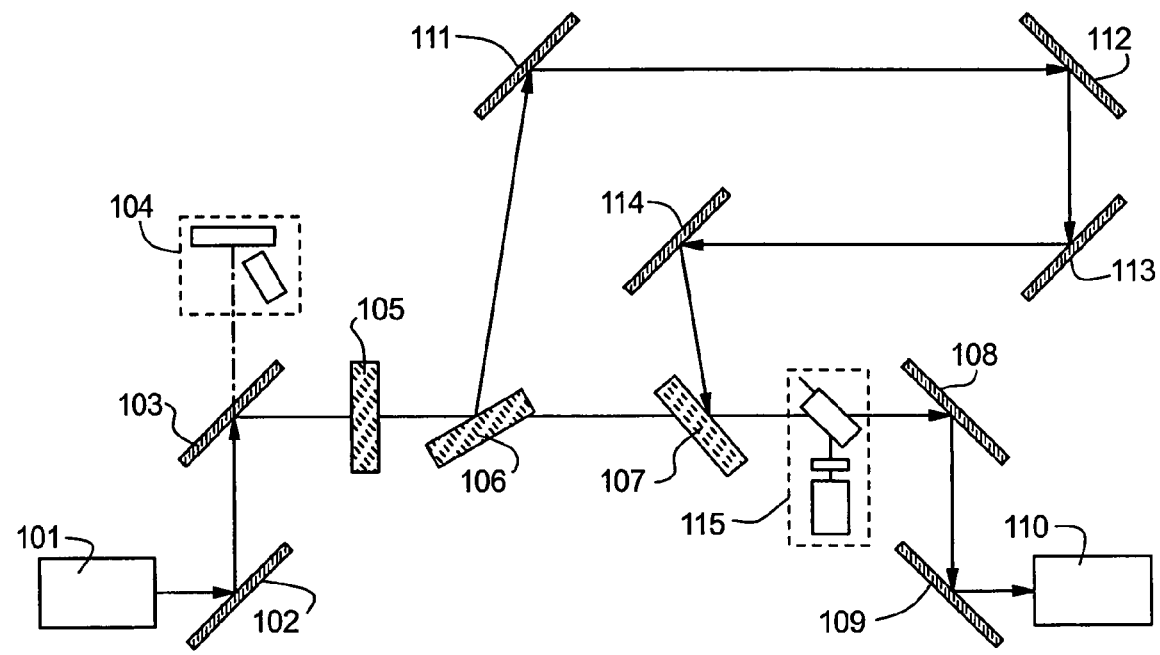
FIG. 1 is a view showing an example of a structure of a laser irradiation apparatus.

FIG. 1 is a view showing an example of a structure of a laser irradiation apparatus of the present invention. This laser irradiation apparatus includes a solid laser oscillator 101, reflecting mirrors 102, 103, 108, 109, 111 to 114, a $\lambda/2$ plate 105, thin film polarizing elements (TFP: Thin Film Polarizer) 106 and 107, and an optical system 110 for forming a laser beam into a linear shape. Reference numeral 104 designates an energy monitor system; and 115, a shutter system.

A laser beam from the laser oscillator 101 is totally reflected by the reflecting mirrors 102 and 103, and reaches the $\lambda/2$ plate 105. The intensity distribution ratio of beams separated by the TFP can be arbitrarily changed by arranging the $\lambda/2$ plate 105 on an optical path.

If the TFP 106 is arranged so that the incident angle of the laser beam becomes the Brewster angle, since reflected light of the p-component (component of an electric field vector vibrating on an incident plane (plane determined by an incident light beam and an incident normal)) of the laser beam becomes 0, the p-component of the laser beam is transmitted through the TFP, and only the s-component (component vibrating on a plane vertical to the incident plane) of the laser beam is totally reflected. The transmitted p-component of the laser beam is irradiated to a substrate via the reflecting mirrors 108 and 109 and the optical system 110.

On the other hand, the totally reflected s-component of the laser beam passes the reflecting mirrors 111 to 114, and then, is totally reflected by the TFP 107 arranged such that the incident angle becomes the Brewster angle, and is irradiated to the substrate via the reflecting mirrors 108 and 109 and the optical system 110. The s-component of the laser beam passes the reflecting, mirrors 111 to 114, so that an optical path length is added to only the s-component of the laser beam, and there arises an optical path difference between the s-component and the p-component of the laser beam having passed through the TFP 106. A value obtained by dividing the optical path length by light speed becomes a time difference between the p-component and the s-component when they are irradiated to the substrate. That is, one pulse laser beam is divided into two pulses, and an optical path difference is provided to one of the pulses, so that the substrate can be irradiated with the pulses while one of the pulses is delayed from the other of the pulses, and the cooling speed of the semiconductor film can be made gentle. Thus, the creation density of crystal nuclei becomes low and the crystallization time becomes long, so that a crystal grain of a large grain size can be formed.

In this embodiment mode of the invention, a laser beam is divided by the s-component and the p-component as polarized components of the laser beam. Since the s-component and the p-component are components independent of each other, interference does not occur when they are synthesized. Thus, in the case where a laser oscillator having a high interference property is used, it is one of very effective dividing methods. Besides, in the case where the s-component and the p-component of laser beams oscillated from different laser oscillators are synthesized, a synthesizing method becomes easy. For example, if another laser oscillator is installed instead of the mirror 114 of FIG. 1, the respective laser beams can be synthesized.

Incidentally, in this embodiment mode of the invention, although the division number of one laser beam is made two, the division number is not limited to two as long as it is plural, and the energy density of each of the divided pulses may not be equal to each other. In this embodiment mode, the energy density can be changed by the $\lambda/2$ plate 105. For example, in the case where the energy density of the laser beam of the first pulse is higher than the energy density of the laser beam of the second or subsequent pulse, since the melting time becomes long, the cooling speed can be made slow. In the case where the energy density of the laser beam of the second or subsequent pulse is higher than the energy density of the laser beam of the first pulse, since the semiconductor film is heated by the laser beam of the first pulse, further enlargement of the grain size can be expected. The optimum values of the added optical path length and the division number of the laser beam are different according to the state of the semiconductor film, the kind of the laser oscillator, and the like.

Embodiment Mode 2

In this embodiment mode for carrying out the invention, an embodiment mode different from Embodiment Mode 1 will be described. In this embodiment mode, an example of a laser irradiation apparatus using a plurality of laser oscillators will be described.

Figure 2:
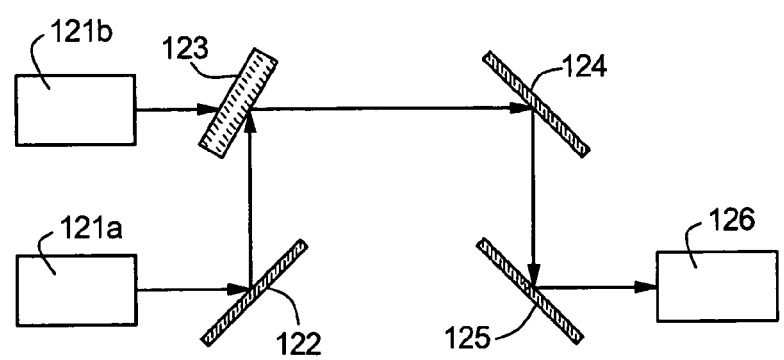
FIG. 2 is a view showing an example of a structure of a laser irradiation apparatus.

FIG. 2 is a view showing an example of a structure of a laser irradiation apparatus of the present invention. This laser irradiation apparatus includes laser oscillators 121a and 121b, reflecting mirrors 122, 124 and 125, a TFP 123, and an optical system 126 for forming a laser beam into a linear shape.

Laser beams are simultaneously oscillated from the laser oscillators 121a and 121b. Although not shown, it is assumed that a TFP is used so that a laser beam 1 emitted from the laser oscillator 121a has only the s-component, and a laser beam 2 emitted form the laser oscillator 121b has only the p-component. After being totally reflected by the reflecting mirror 122, the laser beam 1 reaches the TFP 123. On the other hand, the laser beam 2 reaches the TFP 123 without passing the reflecting mirror and the like. Thus, between the laser beam 1 and the laser beam 2, an optical path difference is produced by a distance between the reflecting mirror 122 and the TFP 123, and a time difference occurs when the beams reach a substrate, so that the cooling speed of a semiconductor film becomes gentle. Thus, the creation density of crystal nuclei becomes low and the crystallization time becomes long, so that a crystal grain of a large grain size can be formed. Besides, by changing the distance between the reflecting mirror 122 and the TFP 123, the optical path difference between the laser beams emitted from the laser oscillators 121a and 121b can be arbitrarily changed.

Further, there is also a method in which when the laser beams are oscillated from the laser oscillators 121a and 121b, for example, after the laser oscillator 121b is oscillated, the laser oscillator 121a is oscillated. As compared with the case where the laser oscillators 121a and 121b are simultaneously oscillated, since it is not necessary to form the optical path difference of the reflecting mirror 122 and the TFP 123, a compact laser irradiation apparatus is formed.

As in this embodiment mode of the invention, in the case where the s-component and the p-component of the laser beams oscillated from the different laser oscillators are synthesized, the synthesizing method becomes easy. Thus, an optical system does not become complicated, and this is very effective in optical adjustment, miniaturization of an apparatus, and the like.

Incidentally, in this embodiment mode of the invention, although two laser oscillators are used, the number is not limited to two as long as it is plural, and the energy density of each of a plurality of pluses may not be equal to each other. Besides, the optimum values of the added optical path length, the number of the laser oscillators, and the like are different by the state of the semiconductor film, the kind of the laser oscillator, and the like.

Embodiment Mode 3

In this embodiment mode for carrying out the invention, an embodiment mode different from Embodiment Mode 1 and Embodiment Mode 2 will be described. In this embodiment mode, an example of a laser irradiation apparatus using a plurality of laser oscillators will be described.

Figure 29:
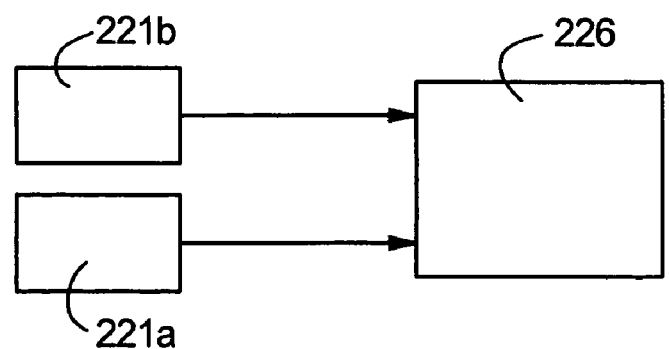
FIG. 29 is a view showing an example of a structure of a laser irradiation apparatus.

FIG. 29 is a view showing an example of a structure of a laser irradiation apparatus of the present invention. This laser irradiation apparatus includes laser oscillators 221a and 221b, and an optical system 226 for forming a laser beam into a linear shape.

Laser beams are oscillated from the laser oscillators 221a and 221b while a time difference is produced by an apparatus (not shown) for controlling oscillation of a laser. Although optical path lengths from the laser oscillators 221a and 221b to the optical system 226 are equal to each other, since times at which the laser beams are oscillated are different from each other, a time difference occurs when the beams reach a substrate, and the cooling speed of a semiconductor film becomes gentle. Thus, the creation density of crystal nuclei becomes low and the crystallization time becomes long, so that a crystal grain of a large grain size can be formed. Besides, by changing the time difference in the oscillation of the laser beams from the laser oscillators 221a and 221b, the time difference between the respective laser beams reaching the substrate can be arbitrarily changed.

In this embodiment mode of the invention, since the optical path difference is not formed by adding an optical path length from at least one laser oscillator of the plurality of laser oscillators to the substrate, a compact laser irradiation apparatus is obtained.

Incidentally, in this embodiment mode of the invention, although two laser oscillators are used, the number is not limited to two as long as it is plural, and the energy density of each of the plurality of laser beams may not be equal to each other.

The present invention having the above constitution will be described further in detail on the basis of embodiments described below.

Embodiment 1

Embodiments of the present invention is explained.

FIG. 1 is a diagram showing an example of a structure of a laser irradiation apparatus of the present invention. The laser irradiation apparatus has the solid state laser oscillator 101, the reflective mirrors 102, 103, 108, 109, and 111 to 115, the λ/2 plate 105, the thin film polarizers (TFPs) 106 and 107, and the optical system 110 for processing laser light into a linear shape. Further, reference numeral 104 denotes the energy monitor system, and reference numeral 115 denotes the shutter system. A YAG laser is used as the solid state laser oscillator in the embodiment 1, and the output time of the laser light having the YAG laser as an oscillation source is (6.7 ns.

Laser light from the laser oscillator 101 is reflected by the reflective mirrors 102 to 104, and arrives at the λ/2 plate 105. By arranging the λ/2 plate 105 in the optical path, the strength distribution ratio of beams separated by, the TFP 106 call be arbitrarily changed. The strengths of the two laser lights formed by division using the TFP 106 are made to be the same in the embodiment 1.

Provided that the TFP 106 is arranged so that the angle of incidence of the laser light becomes the Brewster angle, the amount of reflected light from the laser light having p components, becomes zero (components in which the electric field vector oscillates within the plane of incidence). The p components of the laser light therefore pass through the TFP, and only the s components of the laser light (components in which the electric field vector oscillates within a plane vertical to the plane of incidence) are reflected. The p components of the transmitted laser light are irradiated on a substrate via the reflective mirrors 108 and 109, and the optical system 110.

On the other hand, the s components of the reflected laser light are reflected by the TFP 107, arranged so that the angle of incidence becomes the Brewster angle, after passing through the reflective mirrors 111 to 114, and are irradiated to the substrate via the reflective mirrors 108 and 109, and the optical system 110. By passing the s components of the laser light through the reflective mirrors 111 to 114, a light pass length of only the s components of the laser light is lengthened, and an optical path difference with the p components of the laser light that have passed through the TFP 106 is obtained. A difference in time equal to the value of the lengthened optical path length divided by the speed of light is thus formed between the s components and the p components when the laser light is irradiated to the substrate. Namely, when one laser pulse is separated into two pulses and an optical path length becomes lengthened in one pulse, that pulse can be delayed longer than the other pulse during irradiation of a substrate, and the cooling speed of a semiconductor film can be made slower. The density of nuclei generated therefore becomes lower, the crystallization time becomes longer, and consequently large size crystal grains can be formed.

Further, a simulation was performed for the laser irradiation apparatus having the structure of the embodiment 1 in which, after irradiating one of the pulses divided to a silicon film, the other pulses are given delays of 10, 20, and 30 ns and irradiated to the silicon film. It is known that delay time=optical path difference/speed of light and therefore in order to form delays of 10 ns, the optical path length becomes $10 \times 10^{-9}[s] \times 3 \times 10^8[m/s] = 3[m]$ In other words, the s components of the laser light are irradiated on the surface to be irradiated with a delay of 10 nm after the p components of the laser light provided that the difference between the optical path length from the TFP 106 to the TFP 107 via the reflective mirrors 111 to 114 (the optical path length taken by the s components of the laser light in the embodiment 1), and the optical path length from the TFP 106 to the TFP 107 (the optical path length taken by the p components of the laser light in the embodiment 1) in FIG. 1 is set to 3 m.

Figure 3:
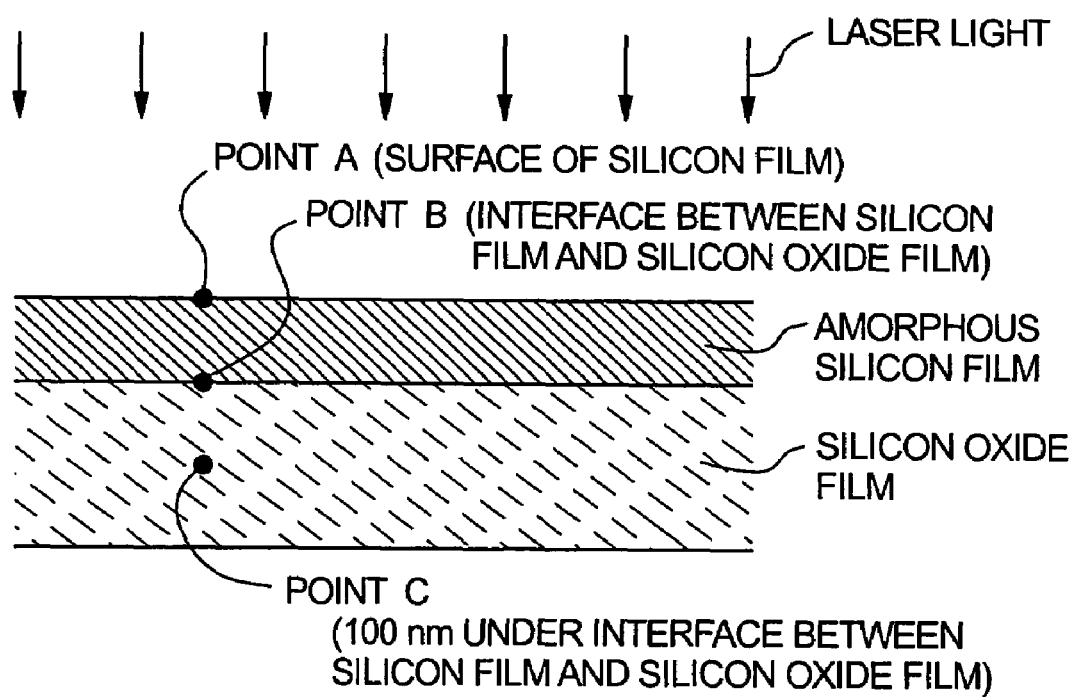
FIG. 3 is a view showing a structure of a semiconductor film used for a simulation, and temperature observation points.
Figure 4A:
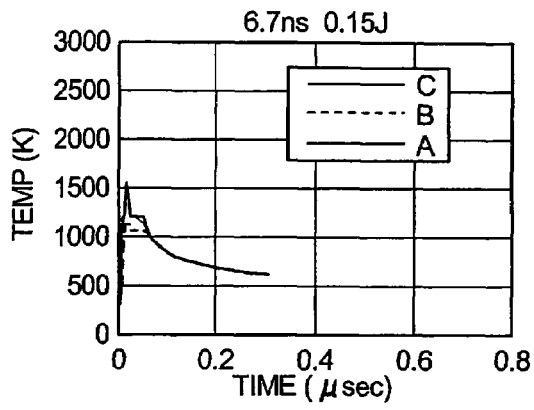
FIGS. 4A to 4D are views showing temperature changes when a laser beam is irradiated to a semiconductor film under conditions that the output time of a YAG laser is 6.7 ns, and the energy density thereof is 0.15 to 0.4 J.
Figure 4B:
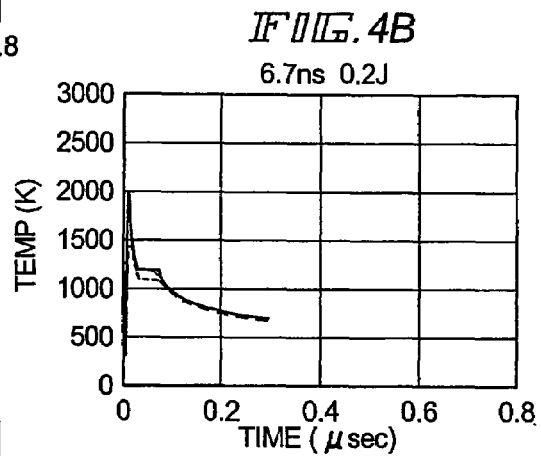
Figure 4C:
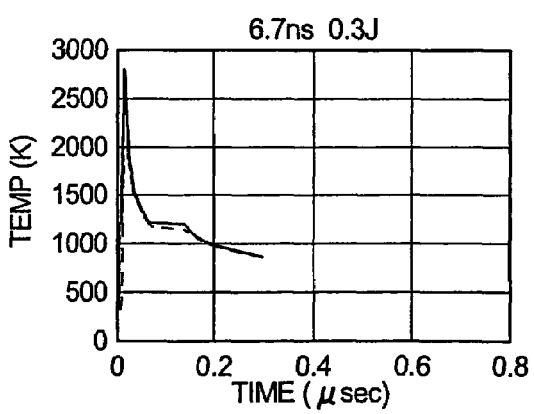
Figure 4D:
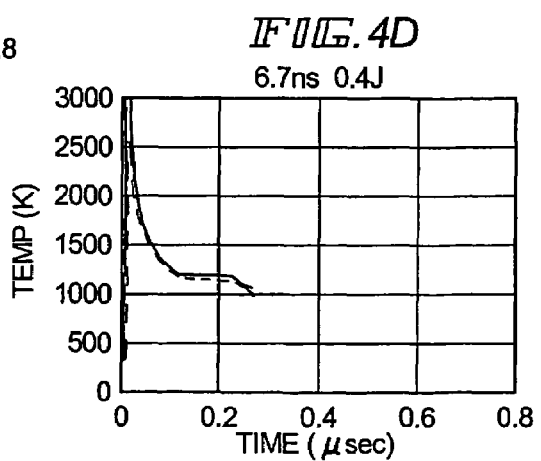
Figure 4E:
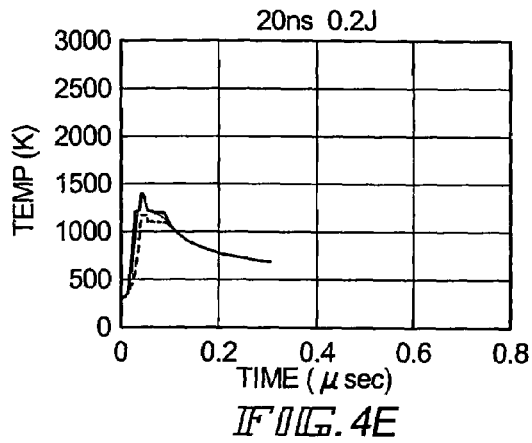
FIGS. 4E to 4H are views showing temperature changes when a laser beam is irradiated to a semiconductor film under conditions that the output time of the YAG laser is 20 ns, and the energy density thereof is 0.2 to 0.5 J.
Figure 4F:
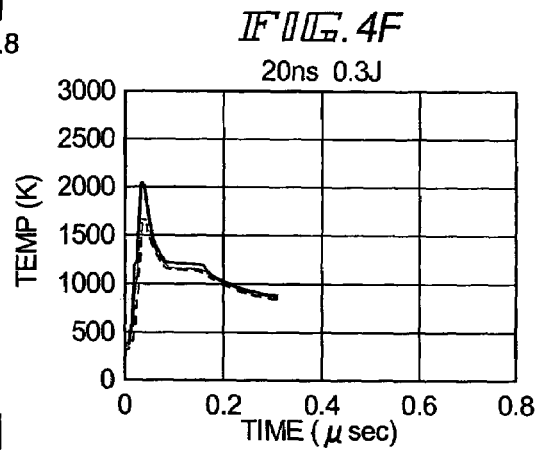
Figure 4G:
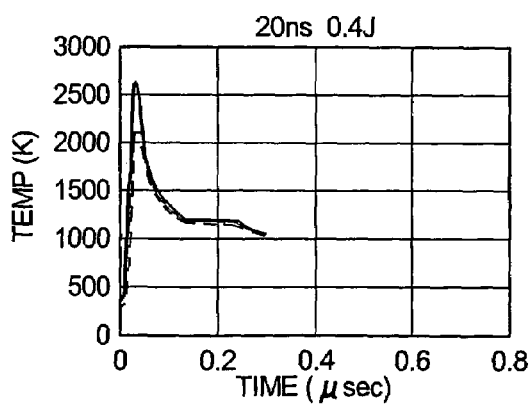
Figure 4H:
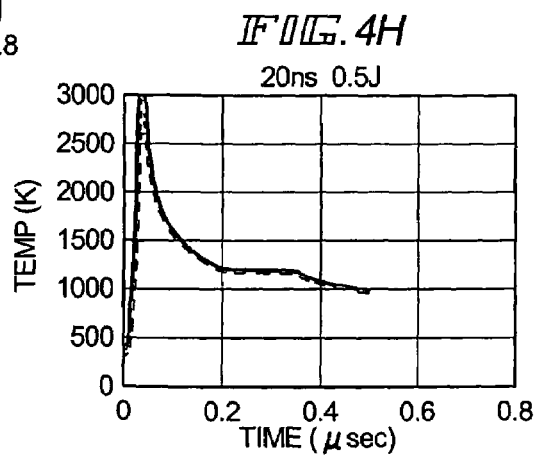
Figure 5A:
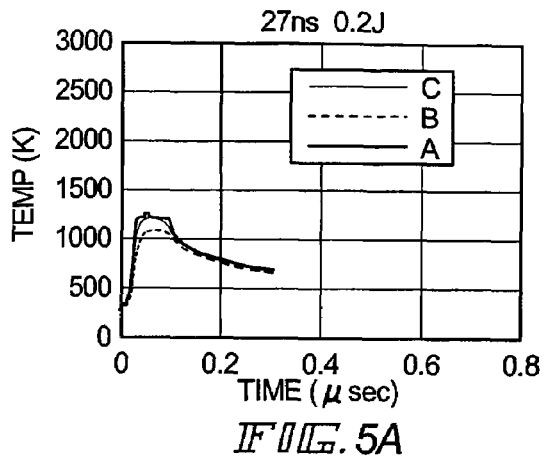
FIGS. 5A to 5D are views showing temperature changes when a laser beam is irradiated to a semiconductor film under conditions that the output time of a YAG laser is 27 ns, and the energy density thereof is 0.2 to 0.5 J.
Figure 5B:
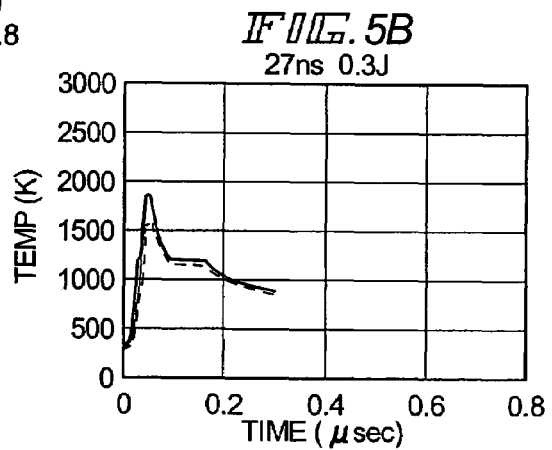
Figure 5C:
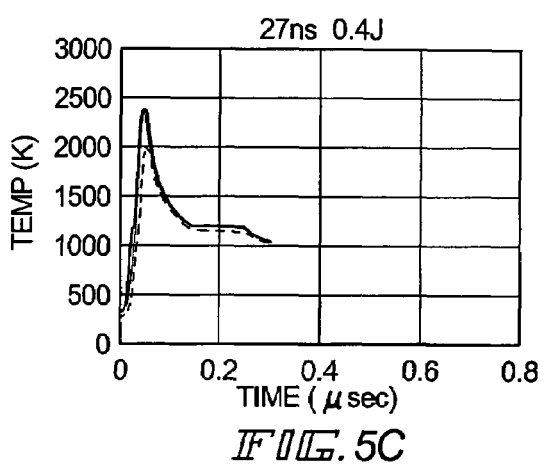
Figure 5D:
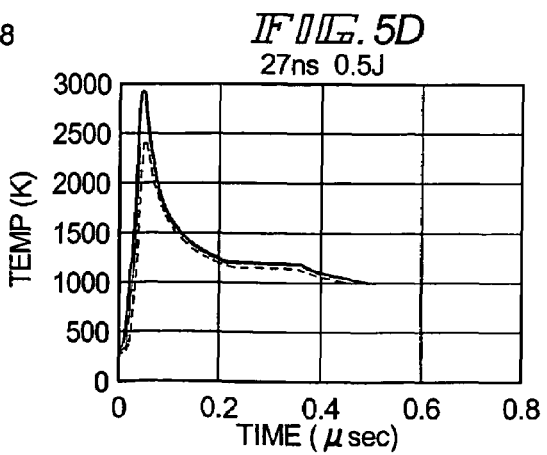
Figure 5E:
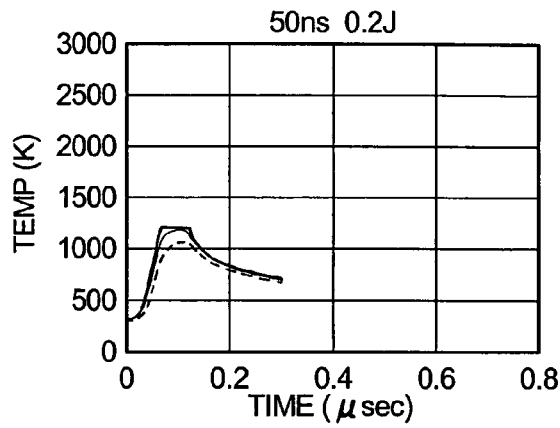
FIGS. 5E to 5H are views showing temperature changes when a laser beam is irradiated to a semiconductor film under conditions that the output time of the YAG laser is 50 ns, and the energy density thereof is 0.2 to 0.5 J.
Figure 5F:
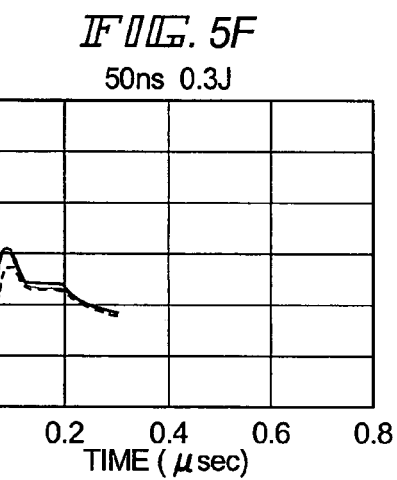
Figure 5G:
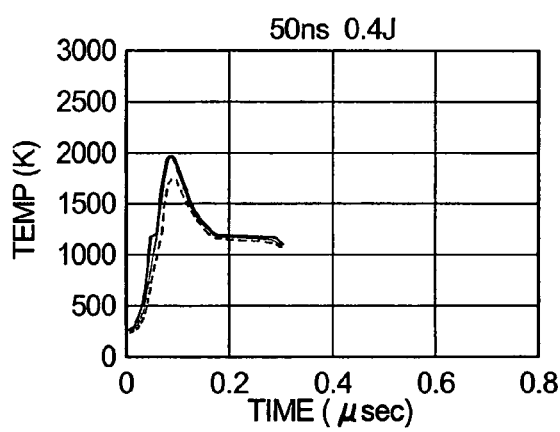
Figure 5H:
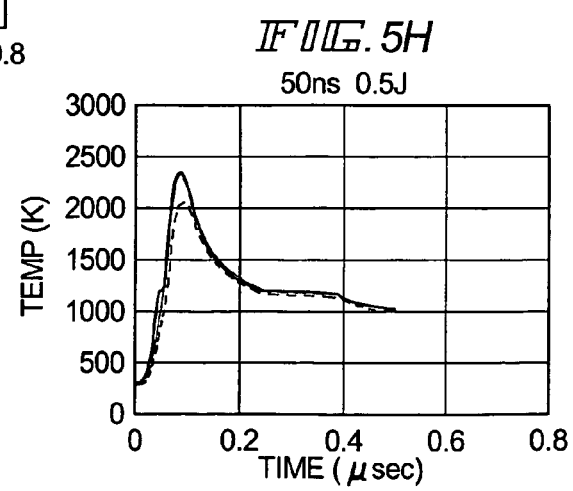
Figure 6A:
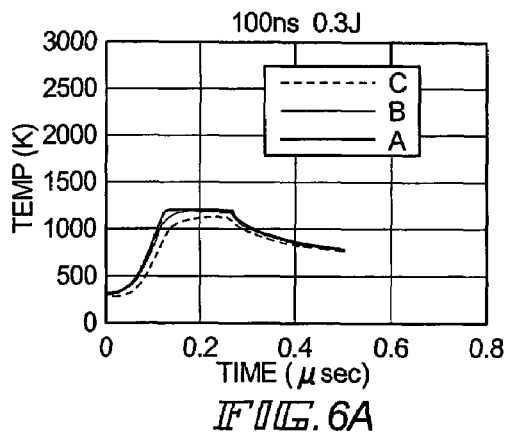
FIGS. 6A to 6C are views showing temperature changes when a laser beam is irradiated to a semiconductor film under conditions that the output time of a YAG laser is 100 ns, and the energy density thereof is 0.3 to 0.5 J.
Figure 6D:
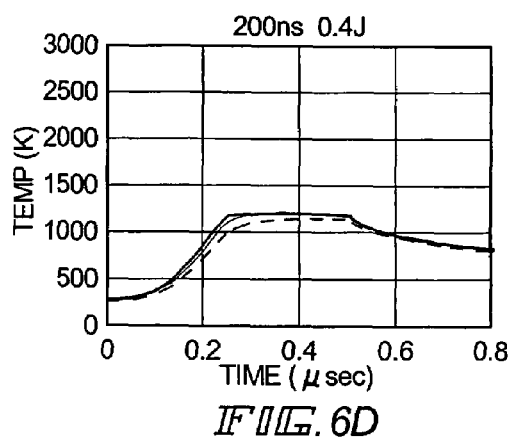
FIGS. 6D to 6F are views showing temperature changes when a laser beam is irradiated to a semiconductor film under conditions that the output time of the YAG laser is 200 ns, and the energy density thereof is 0.4 to 0.6 J.
Figure 6B:
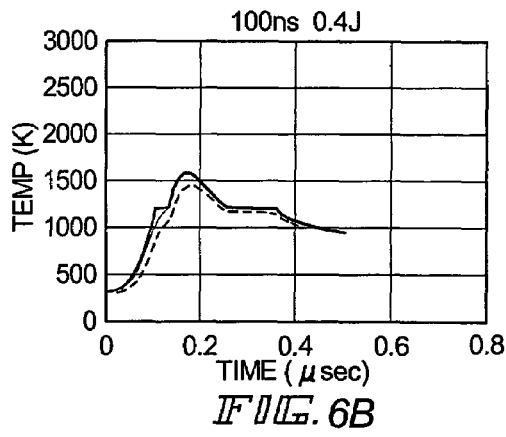
Figure 6E:
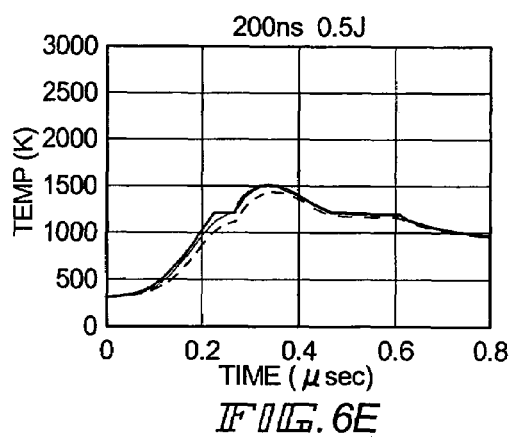
Figure 6C:
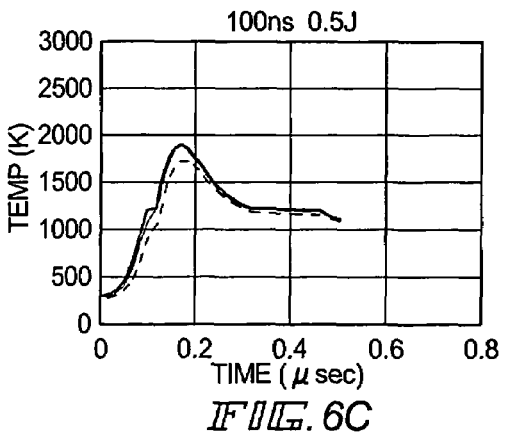
Figure 6F:
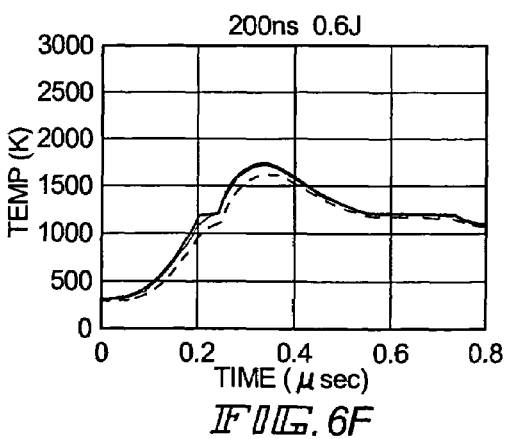
Figure 7A:
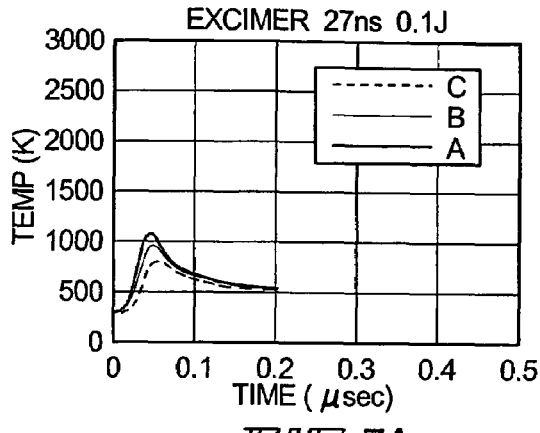
FIGS. 7A to 7G are views showing temperature chances when a laser beam is irradiated to a semiconductor film under conditions that the output time of an excimer laser is 27 ns and the energy density thereof is 0.1 to 0.5 J.
Figure 7B:
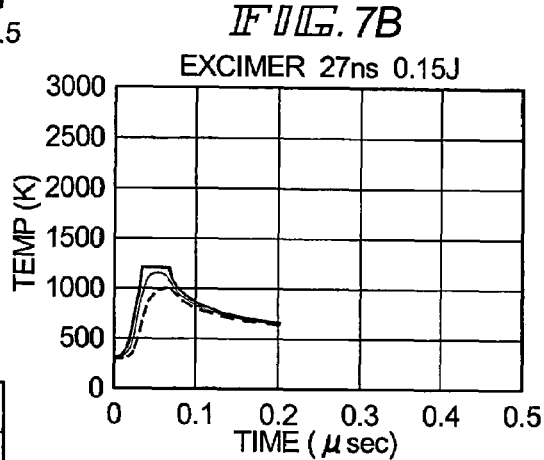
Figure 7C:
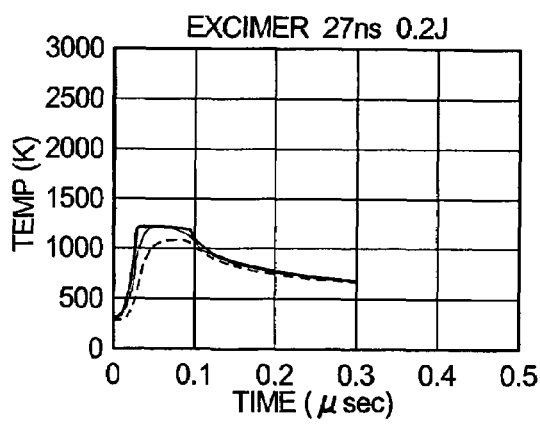
Figure 7D:
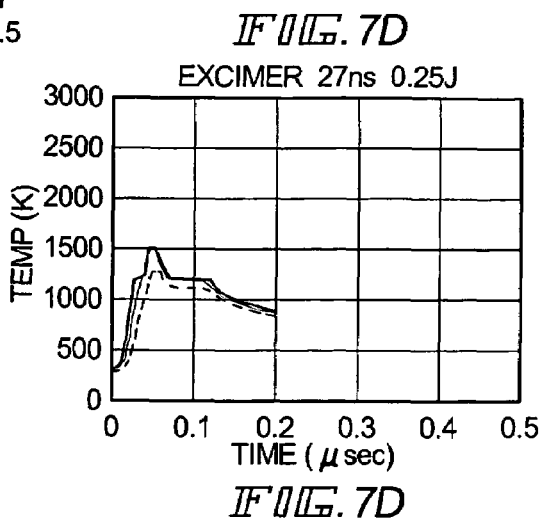
Figure 7E:
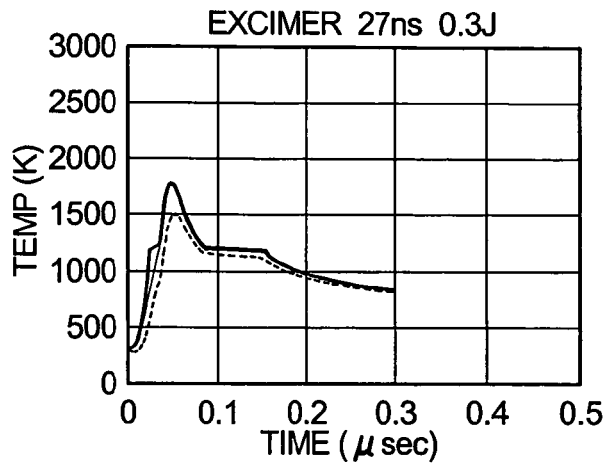
Figure 7F:
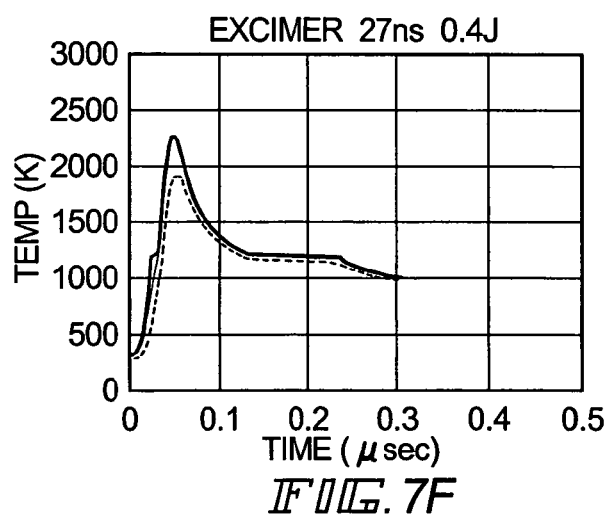
Figure 7G:
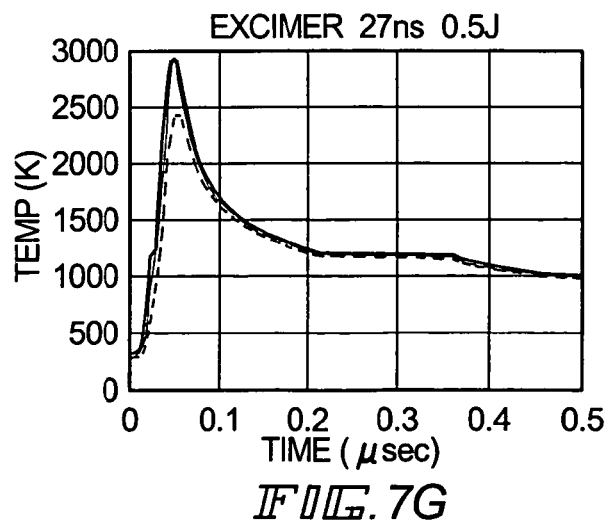
Figure 8A:
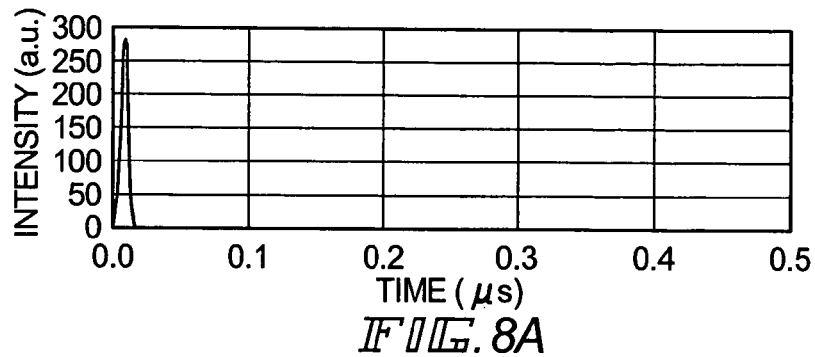
FIGS. 8A to 8D are views showing pulse shapes of a YAG laser used for a simulation.
Figure 8B:
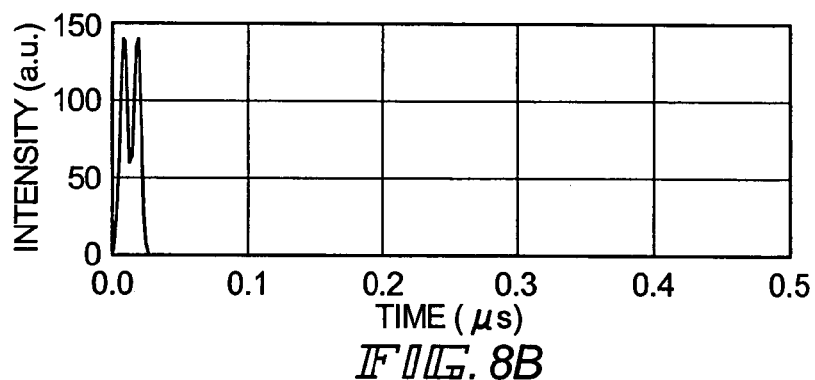
Figure 8C:
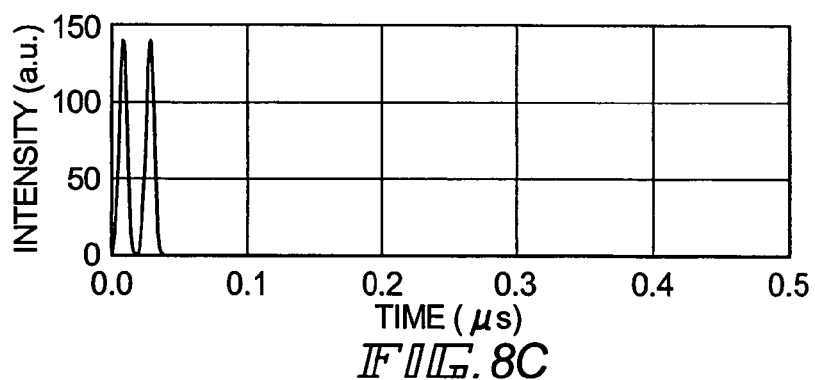
Figure 8D:
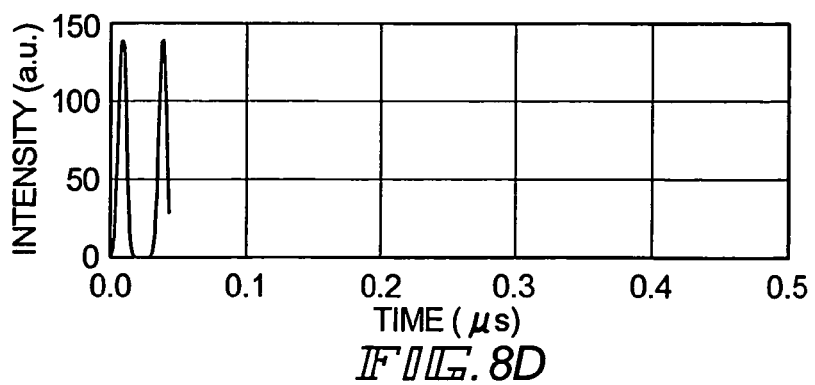
Figure 9A:
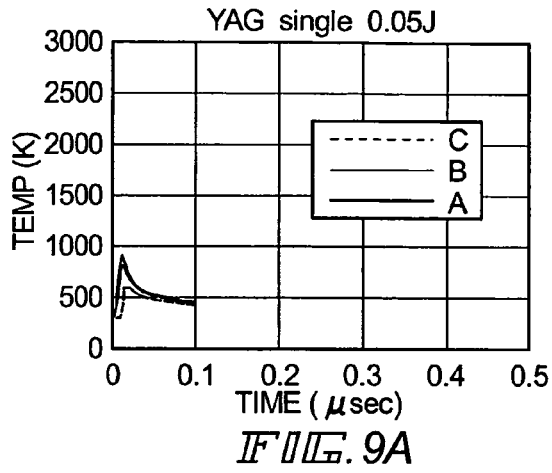
FIGS. 9A to 9F are views showing temperature changes when a YAG laser having the pulse shape shown in FIG. 8A is irradiated to a silicon film having the structure shown in FIG. 3 under conditions that energy density is 0.05 to 0.4 J.
Figure 9D:
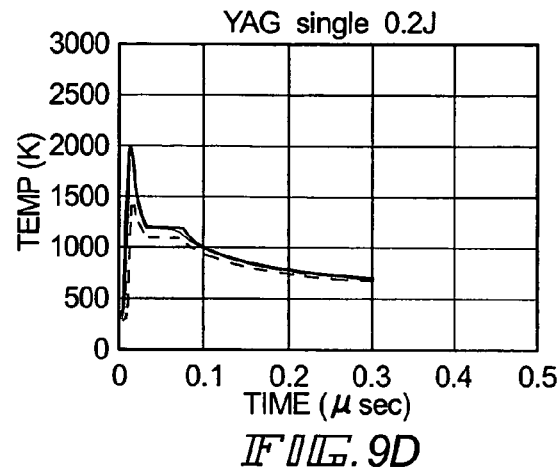
Figure 9B:
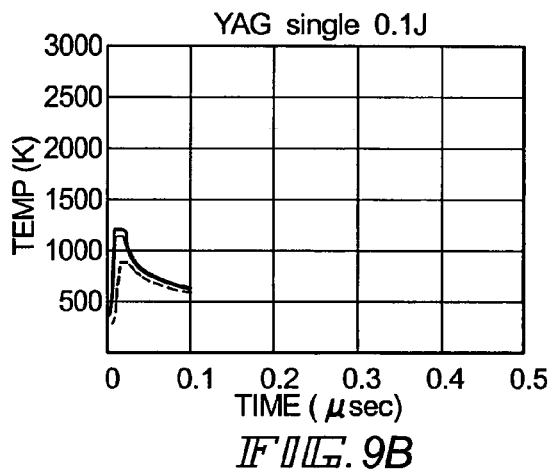
Figure 9E:
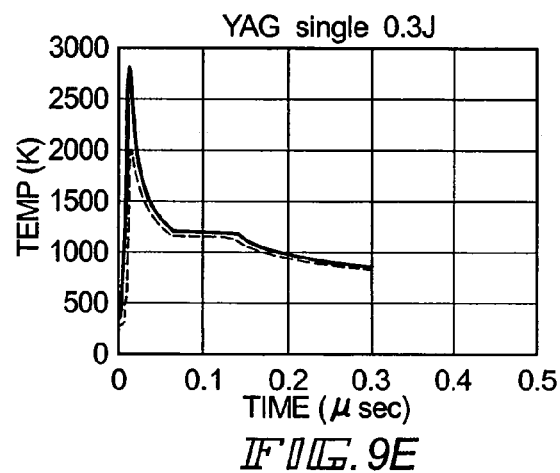
Figure 9C:
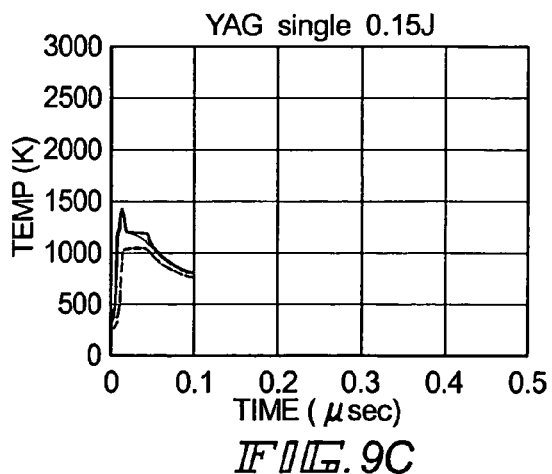
Figure 9F:
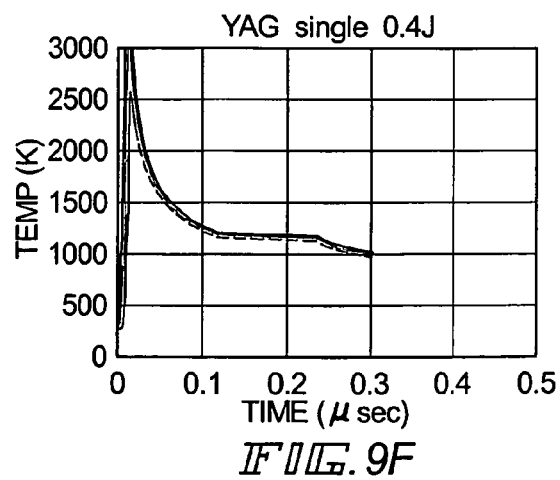
Figure 10A:
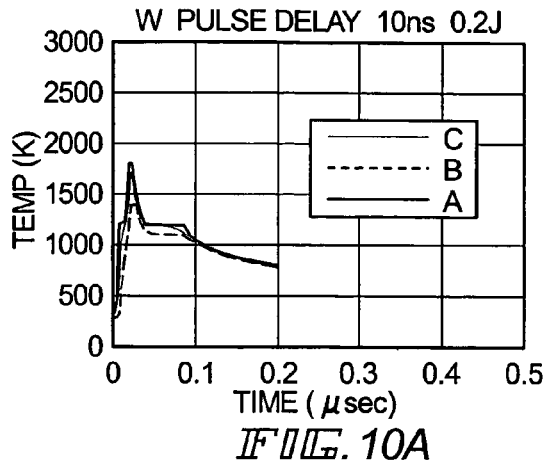
FIGS. 10A to 10C are views showing temperature changes when a semiconductor film is irradiated with a laser beam under conditions that a YAG laser beam is divided into two pulses, one of the pulses is delayed from the other of the pulses by 10 ns, and the energy density is made 0.2 to 0.4 J.
Figure 10D:
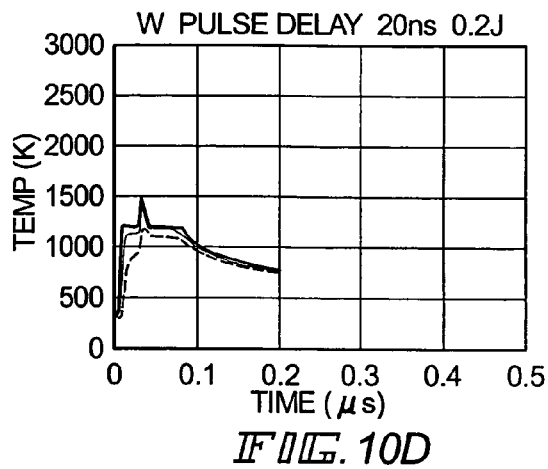
FIGS. 10D to 10F are views showing temperature changes when a semiconductor film is irradiated with a laser beam under conditions that the YAG laser beam is divided into two pulses, one of the pulses is delayed from the other of the pulses by 20 ns, and the energy density is made 0.2 to 0.4 J.
Figure 10B:
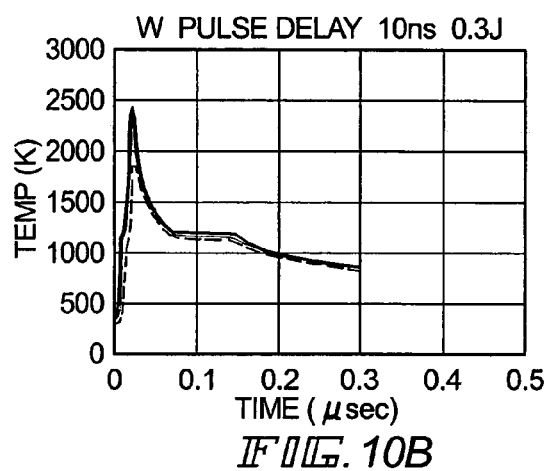
Figure 10E:
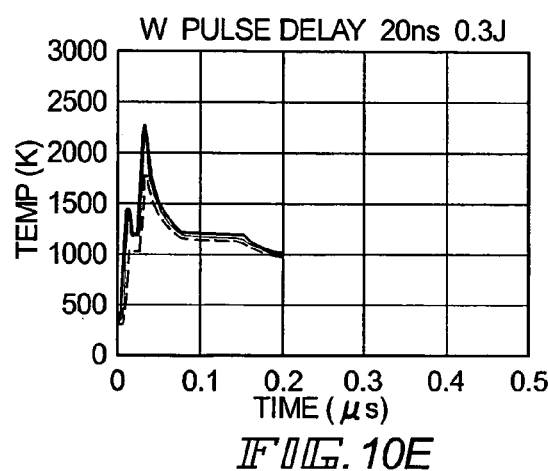
Figure 10C:
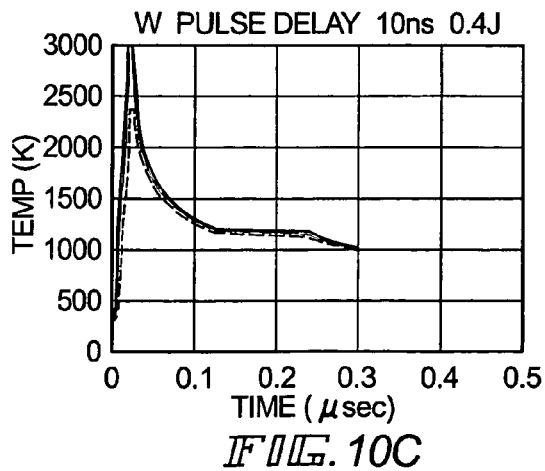
Figure 10F:
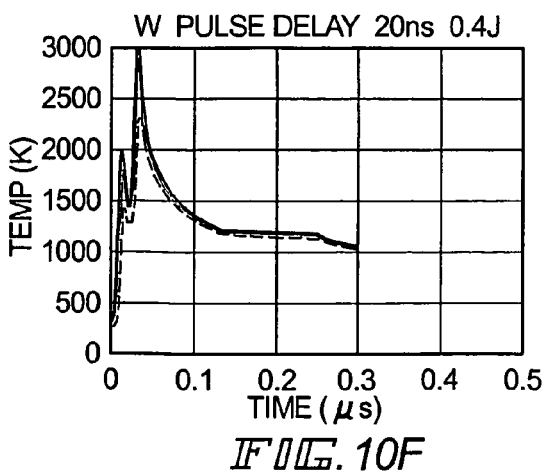
Figure 11A:
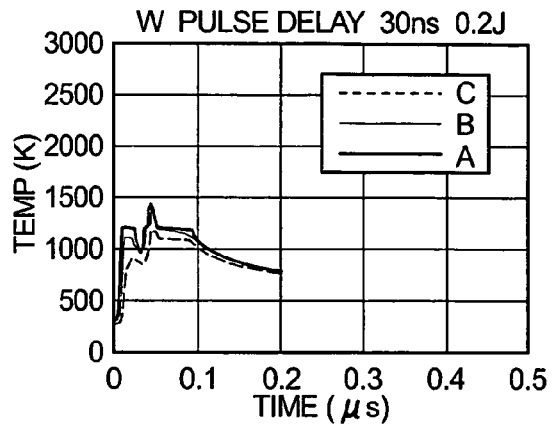
FIGS. 11A to 11C are views showing temperature changes when a semiconductor film is irradiated with a laser beam under conditions that a YAG laser beam is divided into two pulses, one of the pulses is delayed from the other of the pulses by 30 ns, and the energy density is made 0.2 to 0.4 J.
Figure 11B:
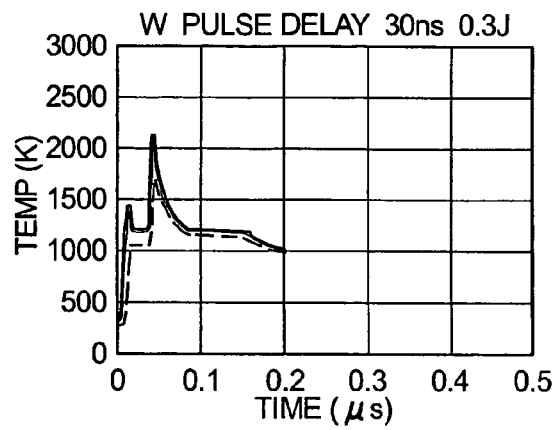
Figure 11C:
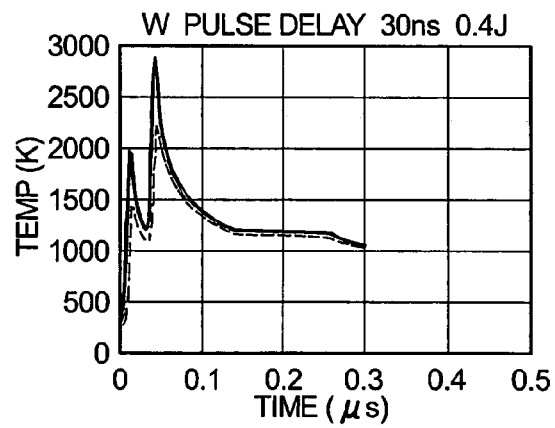
Figure 12:
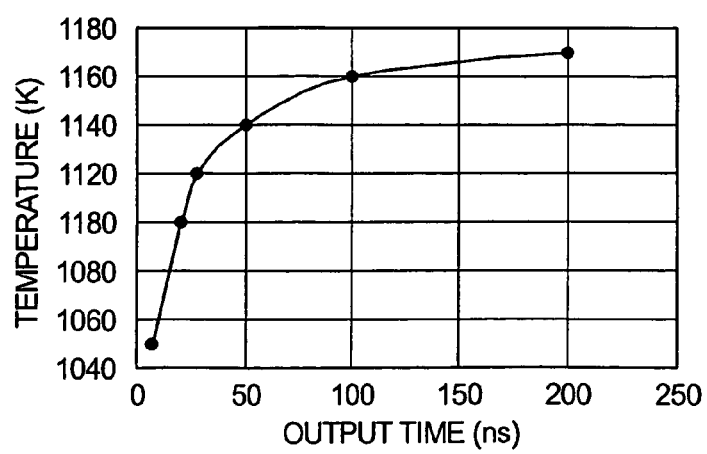
FIG. 12 is a view showing a temperature change of an under film at the crystallization start time of a semiconductor film with respect to an output time of a YAG laser.

The pulse shape of the laser light emitted from the laser oscillators is shown in FIG. 8A. The pulse shown by FIG. 8A is divided into two, and pulse shapes having delays of 10, 20, and 30 ns are as shown in FIGS. 8B to 8D, respectively. Calculations were performed with the second harmonics of the YAG laser with the pulse shapes shown by FIGS. 8B to 8D irradiated to a silicon film with the structure shown in FIG. 3, and temperature versus time was found for the points A to C of FIG. 3. Results are shown in FIGS. 10A to 10C. FIGS. 10D to 10F, and in FIGS. 11A to 11C. Note that, for comparison, simulation results for time versus temperature at the points A to C of FIG. 3 are shown in FIG. 9, for the second harmonic of the YAG laser, having the pulse shape shown in FIG. 8A, irradiated to the silicon film having the structure shown in FIG. 3. The energy density was varied from 0.2 to 0.4 J here. The crystallization time and the melting time are short, and in particular, in the condition with low energy density, the temperature of the point C does not follow changes in the temperature of point A in FIGS. 9A to 9F. However, it can be seen that there is a tendency, for the crystallization time and the melting time to become longer along with lengthening delay time. In other words, the cooling speed becomes slower by delaying, and then irradiating, one pulse after irradiation of the other pulse. The density of generated crystal nuclei therefore becomes lower, and the crystallization time becomes longer, and crystal grains having large size can be formed. If the TFT is formed by using the crystalline semiconductor film thus formed, the electrical characteristic of the above-mentioned TFT become excellent.

Note that although the two laser lights are formed so as to have the same strengths in the embodiment 1, of course they may also be different. After irradiating the p components of the laser light on the semiconductor film in the embodiment 1, the s components of the laser light, which have an optical path length made longer by the reflective mirrors 111 to 114, are then irradiated to the semiconductor film. If the p components of the laser light are stronger than the s components, it is preferable to irradiate the s components of the laser light before the semiconductor film melted by the p components of the laser light begins to crystallize. Further, it the strength of the p components of the laser light are weaker than the s components of the laser light, it is preferable that the semiconductor film melt after the s components of the laser light be irradiated.

Embodiment 2

In this embodiment, a crystal grain obtained when a laser beam is irradiated to a semiconductor film by using the laser irradiation apparatus of the embodiment 1 will be described.

First, a semiconductor film is formed on a substrate, In this embodiment, a 1737 glass substrate of Corning Inc. was prepared as the substrate, and an amorphous silicon film having a thickness of 54 nm was formed by using a plasma CVD method. Subsequently, crystallization of the semiconductor film is performed by a laser annealing using a laser beam. When crystallization is performed by the laser annealing, it is desirable that hydrogen contained in the semiconductor film is released in advance, and it is appropriate that the film is exposed to a nitrogen atmosphere at 400 to 500° C. for about one hour so that a hydrogen content is made 5% atom or less in advance. By this, laser-proof property of the film is remarkably improved. In this embodiment, the substrate was exposed to the nitrogen atmosphere of a temperature of 500° C. for one hour.

Then, crystallization of the semiconductor Film is performed by using the laser irradiation, apparatus having the structure of FIG. 1. In this embodiment, a laser beam was divided into two parts having the same energy by the λ/2 plate 105 and the thin film polarizing element 106 so that double pulses were formed, and after one of the divided pulses was irradiated to the semiconductor film, the other of the pluses was irradiated after a delay of 10 ns. For comparison, a laser beam was not divided but was irradiated, as a single pulse, to the semiconductor film. Besides, irradiation was also repeatedly performed at the same irradiation position while the number of shots was changed.

Figure 13:
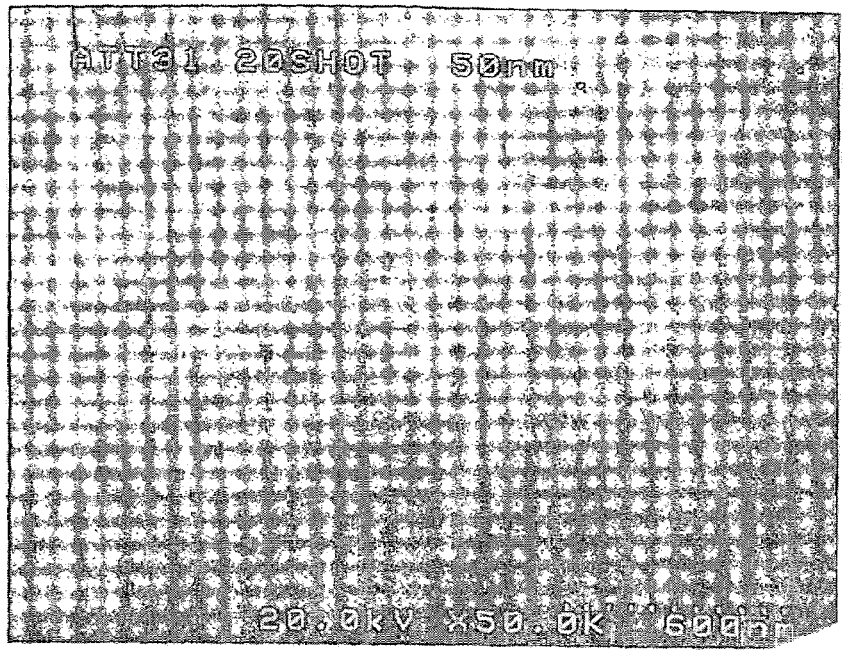
FIG. 13 is a view showing a silicon film after irradiation of a single pulse.
Figure 14:
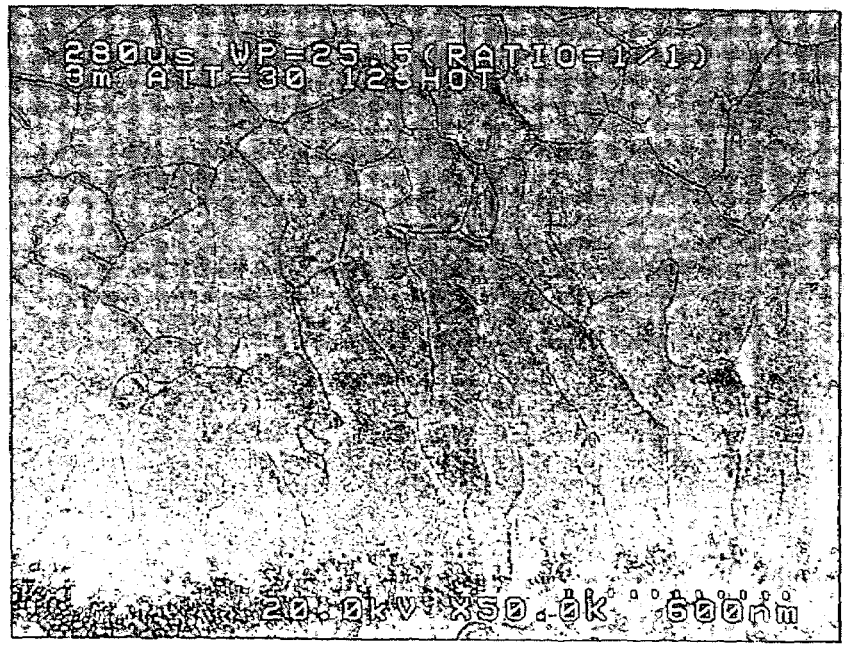
FIG. 14 is a view showing a silicon film after irradiation of double pulses.
Figure 15:
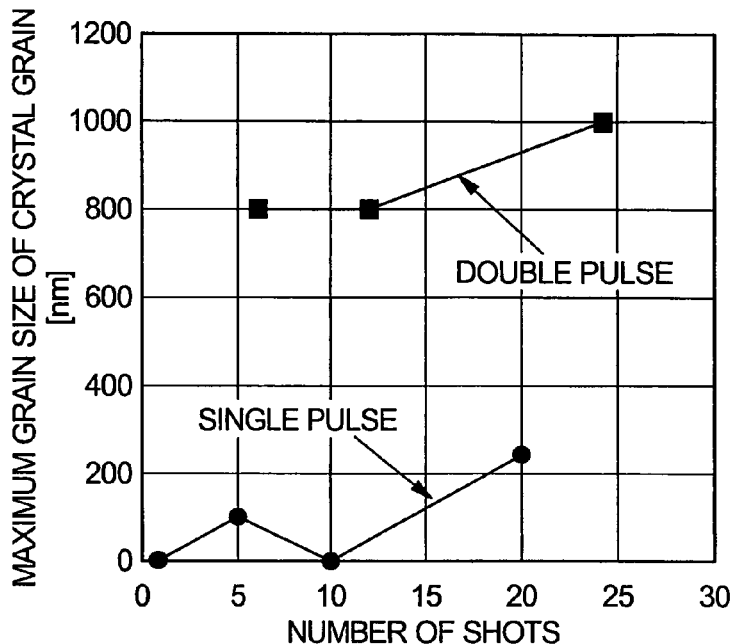
FIG. 15 is a view showing maximum grain sizes of crystal grains formed by irradiation of a single pulse and double pulses to a silicon film.
Figure 16:
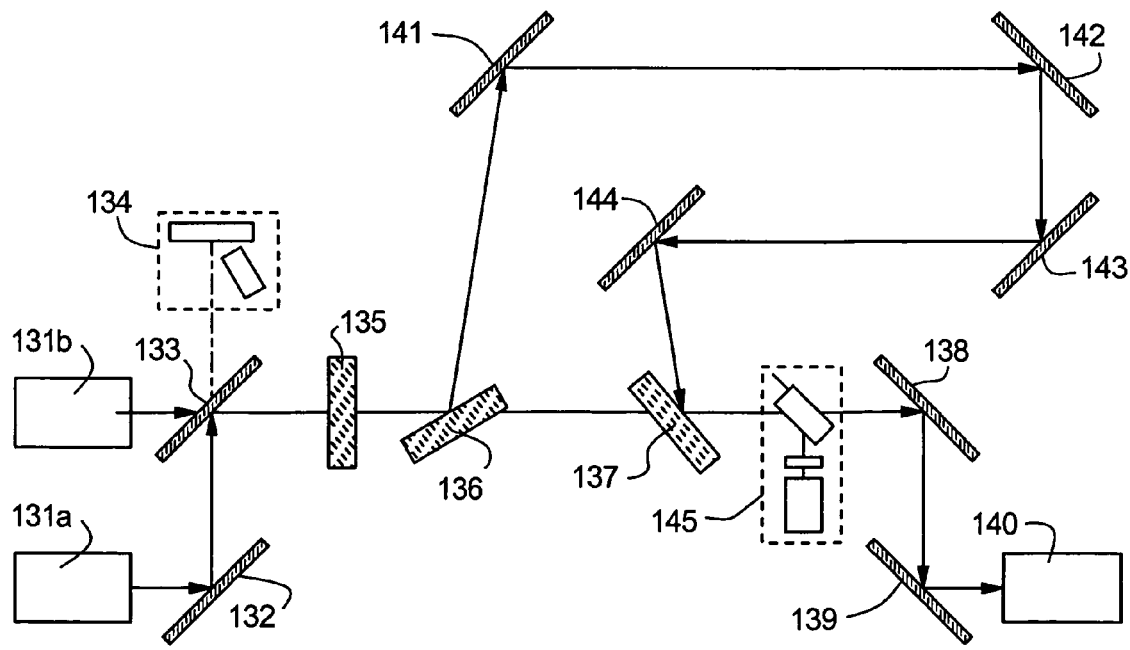
FIG. 16 is a view showing an example of a structure of a laser irradiation apparatus.

The results of the experiments are shown in FIGS. 13 and 14. FIGS. 13 and 14 show examples of results of observation by a SEM with a magnification of fifty thousand after seco-etching is performed to the semiconductor film subsequent to laser irradiation. FIG. 13 shows a semiconductor film after the irradiation of 20 shots of single pulses, and FIG. 14 shows a semiconductor film after the irradiation of 12 shots of double pulses. From FIGS. 13 and 14, it is understood that a crystal grain of a larger grain size can be obtained when the irradiation is performed after the laser beam is divided into two parts. FIG. 15 shows results of measurement oft maximum grain sizes of crystal grains formed when the number of shots is changed. Also from FIG. 15, it is understood that a crystal grain of a larger grain size can be obtained when irradiation is performed after the laser beam is divided into two parts.

As described above, it is also experimentally confirmed that when a laser beam is divided and is irradiated to a semiconductor film, a crystal grain of a large size is formed. If a TFT is manufactured by using a crystalline semiconductor film formed in this way, the electrical characteristics of the TFT become excellent.

Embodiment 3

An embodiment differing from the embodiment 1 is explained in the embodiment 3. An example of a laser irradiation apparatus using a plurality of laser oscillators is shown in the embodiment 3.

FIG. 2 is a diagram showing an example of a structure of a laser irradiation apparatus of the present invention. The laser irradiation apparatus has the laser oscillators 121a and 121b, the reflective mirrors 122, 124, and 125, the TFP 123, and the optical system 126 for processing laser light into a linear shape. Two YAG lasers are used as the laser oscillators in the embodiment 3.

Laser light is emitted at the same time from the laser oscillators 121a and 121b. Although not shown in the figure, by using a TFP, the first laser light 1 emitted from the laser oscillator 121a is made to have only s components, and the second laser light 2 emitted form the laser oscillator 121b is made to have only p components. The laser light 1 is reflected by the reflective mirror 122, after which it arrives at the TFP 123. The laser light 2, on the other hand, arrives at the TFP 123 without going by way of reflective mirrors and the like. An optical path difference is thus formed between the laser light 1 and the laser light 2 in accordance with the distance between the reflective mirror 122 and the TFP 123. A difference in time required to reach a substrate develops, and the cooling speed of a semiconductor film becomes slower. The density of crystal nuclei that develop therefore becomes lower, and the crystallization time becomes longer, and large size crystal grains can be formed. Furthermore, the optical path difference between the laser lights emitted from the laser oscillators 121a and 121b can be arbitrarily changed by changing the distance between the reflective mirror 122 and the TFP 123.

In addition, there is also a method for oscillating the laser oscillator 121a, for example, after oscillating the laser oscillator 121b, when emitting laser light from the laser oscillators 121a and 121b. Compared to having simultaneous laser light emission from the laser oscillators 121a and 121b, optical path differences between the reflective mirror 122 and the TFP 123 need not be formed with this method, resulting in a compact laser irradiation apparatus.

Embodiment 4

An example of a laser irradiation apparatus combining the embodiment 1 and the embodiment 2 is shown in the embodiment 4.

FIG. 13 is a diagram showing an example of a structure of a laser irradiation apparatus of the present invention. The laser irradiation apparatus has solid state laser oscillators 131a and 131b, reflective mirrors 132, 138, 139, and 141 to 145, a λ/2 plate 135, thin film polarizers (TFPs) 133, 136, 137, and an optical system 140 for processing laser light into a linear shape. Further, reference numeral 104 denotes the energy monitor system, and reference numeral 145 denotes a shutter system. Two YAG lasers are used as the solid state laser oscillators in the embodiment 4.

Laser light is emitted at the same time from the laser oscillators 131a and 131b. Although not shown in the figure by using a TFP, the first laser light 1 emitted from the laser oscillator 131a is made to have only s components, and the second laser light 2 emitted form the laser oscillator 131b is made to have only p components. The laser light 1 is reflected by the reflective mirror 132, after which it arrives at the TFP 133. The laser light 2, on the other hand, arrives at the TFP 133 without going by a of reflective mirrors and the like. An optical path difference is thus formed between the laser light 1 and the laser light 2 in accordance with the distance between the reflective mirror 132 and the TFP 133, and a difference in time for reaching the substrate develops.

Provided that the TFP 136 is arranged so that the angle of incidence of the laser light becomes the Brewster angle, the amount of reflected light from the laser light having p components, becomes zero (components in which the electric field vector oscillates within the plane of incidence). The p components of the laser light therefore pass through the TFP, and only the s components of the laser light (components in which the electric field vector oscillates within a plane vertical to the plane of incidence) are reflected. The p components of the transmitted laser light are irradiated on a substrate via the reflective mirrors 138 and 139, and the optical system 140.

On the other hand, the s components of the reflected laser light are reflected by the TFP 137, arranged so that the angle of incidence becomes the Brewster angle, after passing through the reflective mirrors 141 to 144, and are irradiated to the substrate via the reflective mirrors 138 and 139, and the optical system 140. By passing through the reflective mirrors 141 to 144, only the s components of the laser light have an optical path length that becomes lengthened, and an optical path difference with the p components of the laser light which pass through the TFP 136 is formed. A difference in time for the laser lights arriving at the substrate therefore develops in the embodiment 3 due to the optical path difference caused by the distance between the reflective mirror 132 and the TFP 133, and by the optical path difference due to the reflective mirrors 141 to 144, and the cooling speed of the semiconductor film can be made slower. The density of crystal nuclei that develop consequently becomes less, and the crystallization time becomes longer, and therefore crystal grains having a large grain size can be formed. By forming the TFT by using the crystalline semiconductor film fabricated in this way, the electronic properties of the above-mentioned TFT can be promoted.

Embodiment 5

In this embodiment, the manufacturing method of the active matrix substrate is explained using FIGS. 17 to 21.

First, in this embodiment, a substrate 300 is used, which is made of glass such as barium borosilicate glass or aluminum borosilicate, represented by such as Corning #7059 glass and #1737 glass. Note that, as the substrate 300, a quartz substrate, a silicon substrate, a metallic substrate or a stainless substrate on which is formed an insulating film. A plastic substrate with heat resistance to a process temperature of this embodiment may also be used.

Then, a base film 301 formed of an insulating film such as a silicon oxide film, is a silicon nitride film or a silicon oxynitride film is formed on the substrate 300, in this embodiment, a two-layer structure is used as the base film 301. However, a single-layer film or a lamination structure consisting of two or more layers of the insulating film may be used. As a first layer of the base film 301, a silicon oxynitride film 301a is formed with a thickness of 10 to 200 nm (preferably 50 to 100 nm) with a plasma CVD method using $SiH_4$, $NH_3$, and $N_2O$ as reaction gas. In this embodiment, the silicon oxynitride film 301a (composition ratio Si=32%, O=27%, N=24% and H=17%) with a film thickness of 50 nm is formed. Then, as a second layer of the base film 301, a silicon oxynitride film 301b is formed and laminated into a thickness of 50 to 200 nm (preferably 100 to 150 nm) with a plasma CVD method using SiH, and $N_2O$ as reaction gas. In this embodiment, the silicon oxynitride film 301b (composition ratio Si=32%, O=59%, N=7% and H=2%) with a film thickness of 100 nm is formed.

Subsequently, semiconductor layer 302 are formed on the base film. The semiconductor layer 302 are formed from a semiconductor film with an amorphous structure which is formed by a known method (such as a sputtering method, all LPCVD method, or a plasma CVD method) into the thickness of from 25 to 80 nm (preferably 30 to 60 nm). The material of the crystalline semiconductor film is not particularly limited, but it is preferable to be formed of silicon, a silicon germanium (SiGe) alloy, or the like. In this embodiment, 55 nm thick amorphous silicon film is formed by a plasma CVD method.

The semiconductor film is crystallized next. The laser annealing is applied to crystallization of the semiconductor film. Further, other than laser annealing, thermal crystallization or thermal crystallization using nickel as a catalyst are applicable for a crystallization of the semiconductor film. The crystallization of the semiconductor film is subjected by a method of combination in which laser annealing and one of these crystallization methods above. The laser annealing is implemented by applying the present invention. For example, the laser light, by which a solid laser (YAG laser. $YVO_4$ laser or the like) is set as a light source, is divided into a plurality of laser light. The optical path length of a laser light or more to the irradiation surface is made longer than that of the other laser light to the above-mentioned irradiation surface, and the laser light is irradiated to the semiconductor film. In this embodiment, after the substrate is exposed in the nitrogen atmosphere of 500° C. temperature for 1 hour, the crystallization of the semiconductor film is conducted by using the laser irradiation device shown in FIG. 1, whereby the crystalline semiconductor film having the crystal grains of large grain size is formed. Here, the YAG laser is used for the laser oscillator. The laser light modulated into the second harmonic by nonlinear optical element is processed into the linear beam by an optical system and irradiated to the semiconductor film. When the linear beam in irradiated to the semiconductor film, although the overlap ratio can be set from 50 to 98%, the ratio may be set suitably by the operator because the optimum conditions are different according to the state of the semiconductor film and the delay time of the laser light.

Thus formed the crystalline semiconductor film is patterned into the desired shape to form the semiconductor layers 402 to 406. In this embodiment, the crystalline silicon film is processed patterning by using the photolithography to form the semiconductor layer 402 to 406.

Further, after the formation of the semiconductor layer 402 to 406, a minute amount of impurity element (boron or phosphorus) may be doped to control a threshold value of the TFT.

A gate insulating film 407 is then formed for covering the semiconductor layers 402 to 406. The gate insulating film 407 is formed of an insulating film containing silicon by a plasma CVD method or a sputtering method into a film thickness of from 40 to 150 nm. In this embodiment, the gate insulating film 407 is formed of a silicon oxynitride film into a thickness of 110 nm by a plasma CVD method (composition ratio Si=32%, O=59%, N=7%, and H=2%). Of course, the gate insulating film is not limited to the silicon oxynitride film, and an other insulating film containing silicon may be used as a single layer or a lamination structure.

Besides, when the silicon oxide film is used, it can be possible to be formed by a plasma CVD method in which TEOS (tetraethyl orthosilicate) and $O_2$ are mixed and discharged at a high frequency (13.56 MHZ) power density of 0.5 to 0.8 W cm$^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Then, as shown in FIG. 17B, on the gate insulating film 407, a first conductive film 408 with a thickness of 20 to 100 nm and a second conductive film 409 with a thickness of 100 to 400 nm are formed and laminated. In this embodiment, the first conductive film 408 of TaN film with a film thickness of 30 nm and the second conductive film 409 of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride ($WF_6$). Whichever method is used, it is necessary to make the material have low resistance for use as the gate electrode, and it is preferred that the resistivity of the W film is set to less than or equal to 20 μΩcm. By making the crystal grains large, it is possible to make the W film have lower resistivity. However, in the case is where many impurity elements such as oxygen are contained within the W film, crystallization is inhibited and the resistance becomes higher. Therefore, in this embodiment, by forming the W film by a sputtering method using, a W target with a high purity of 99.9999% and in addition, by taking sufficient consideration to prevent impurities within the gas phase from mixing therein during the film formation, a resistivity of from 9 to 20 μΩcm can be realized.

Note that, in this embodiment, the first conductive film 408 is made of TaN, and the second conductive film 409 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified polycrystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, masks 410 to 415 made of resist are formed using a photolithography method, and a first etching process is performed in order to form electrodes and wirings. This first etching process is performed with the first and second etching conditions. In this embodiment, as the first etching conditions, an ICP (inductively coupled plasma) etching method is used, a gas mixture of $CF_4$, $Cl_2$, and $O_2$ is used as an etching gas, the gas flow rate is set to 25/25/10 sccm, and plasma is generated by applying a 500 W RF (13.56 MHZ) power to a coil shape electrode under 1 Pa. A dry etching device with ICP (Model E645-☐ICP) produced by Matsushita Electric Industrial Co. Ltd. is used here. A 150 W RF (13.56 MHZ) power is also applied to the substrate side (test piece stage) to effectively apply a negative self-bias voltage. The W film is etched with the first etching conditions, and the end portion of the first conductive layer is formed into a tapered shape.

Thereafter, the first etching conditions are chanced into the second etching conditions without removing the masks 410 to 415 made of resist, a mixed gas of $CF_4$ and $Cl_2$ is used as an etching gas, the gas flow rate is set to 30/30 sccm, and plasma is generated by applying a 500 W RF (13.56 MHZ) power to a coil shape electrode under 1 Pa to thereby perform etching for about 30 seconds. A 20 W RF (13.56 MHZ) power is also applied to the substrate side (test piece stage) to effectively a negative self-bias voltage. The W film and the TaN film are both etched on the same order with the second etching conditions in which $CF_4$ and $Cl_2$ are mixed. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 417 to 422 (first conductive layers 417a to 422a and second conductive layers 417b to 422b) constituted of the first conductive layers and the second conductive layers are formed by the first etching process. Reference numeral 416 denotes a gate insulating film, and regions of the gate insulating film which are not covered by the first shape is conductive layers 417 to 422 are made thinner by approximately 20 to 50 nm by etching.

Then, a first doping process is performed to add an impurity element for imparting an n-type conductivity to the semiconductor layer without removing the mask made of resist (FIG. 18A). Doping may be carried out by an ion doping method or an ion implantation method. The condition of the ion doping method is that a dosage is $1\times10^{13}$ to $5\times10^{15}$ atoms/$cm^2$, and an acceleration voltage is 60 to 100 keV. In this embodiment, the dosage is $1.5\times10^{15}$ atoms/$cm^2$ and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 417 to 421 become masks to the impurity element for imparting the n-type conductivity, and high concentration impurity regions 306 to 310 are formed in a self-alignment manner. The impurity element for imparting the n-type conductivity is added to the high concentration impurity regions 306 to 310 in the concentration range of $1\times10^{20}$ to $1\times10^{21}$ atoms/$cm^3$.

Thereafter, a second etching process is performed without removing the masks made of resist. A mixed gas of $CF_4$, $Cl_2$ and $O_2$ may be used as etching gas used and the W film is selectively etched. The second conductive layers 428b to 433b are formed by a second etching process. On the other hand, the first conductive layers 417a to 422a are hardly etched, and the second conductive layers 428 to 433 are formed.

Next, a second doping process is performed as shown in FIG. 18B without removing the masks from resists. The impurity elements which imparts n-type conductivity is doped under the condition that the dose amount is lower than that of a first doping process with an acceleration voltage 70 to 120 keV. In this embodiment, the dosage is $1.5\times10^{14}$ atoms/$cm^2$, and the acceleration voltage is 90 keV. The second doping process is using a second shaped conductive layers 428 to 433 as masks, and the impurity elements is doped with a semiconductor layer at the below of the second conductive layers 428b to 433b. High concentration impurity regions 423a to 427a and low concentration impurity region 423b to 427b are newly formed.

Next, after the masks are removed, masks 434a and 434b form resists are newly formed, and the third etching process is performed as shown in FIG. 18C. A mixed gas of $SF_6$ and $Cl_2$ is used as an etching gas, the gas flow rate is set to 50 10 sccm, and plasma us generated by applying a 500 W RF (13.56 MHZ) power to a coil shape electrode under 1 Pa to thereby perform etching for about 30 seconds. A 10 W RF (13.56 MHZ) power is also applied to the substrate side (test piece stage) to effectively applied to a negative self-bias voltage. Thus the third shape conductive layers 435 to 438 etching a TaN film of the p-channel type TFT and the TFT of the pixel portion (pixel TFT) by above-mentioned third etching process.

Next, after removing the masks from resists, the insulating layers 439 to 444 is formed, removing selectively the gate insulating film 416 and using the second shape conductive layer 428, 430 and the second shape conductive layers 435 to 438 as a mask. (FIG. 19A)

Successively, there is carried out a third doping processing by newly forming masks 445a to 445c comprising resists. By the third doping processing, there are formed impurity regions 446, 447 added with an impurity element for providing a conductive type reverse to the above-described one conductive type at semiconductor layers constituting activation layers of p-channel type TFTs. The impurity regions are formed self-adjustingly by adding the impurity element providing p-type by using the second conductive layers 435a, 438a as masks against the impurity element. In this embodiment, the impurity regions 446, 447 are formed by an ion doping process using diborane ($B_2H_6$). (FIG. 19B) In the third doping processing, the semiconductor layers forming n-channel type TFTs are covered by the masks 445a to 445c comprising resists. Although the impurity regions 446, 447 are added with phosphorus at concentrations different from each other by the first doping processing and the second doping process, in any of the regions, by carrying out the doping processing such that the concentration of the impurity element for providing p-type falls in a range of $2\times10^{20}$ through $2\times10^{21}$ atoms/$cm^3$, the impurity regions function as source regions and drain regions of p-channel type TFTs and accordingly, no problem is posed. In this embodiment, portions of the semiconductor layers constituting activation layers of p-channel type TFTs are exposed and accordingly, there is achieved an advantage that the impurity element (boron) is easy to add thereto.

The impurity regions are formed at the respective semiconductor layers b the above-described steps.

Next, a first interlayer insulating film 461 is formed by removing the masks 445a to 445c comprising resists. The first interlayer insulating film 461 is formed by an insulating film including silicon and having a thickness of 100 through 200 nm by using a plasma CVD process or a sputtering process. In this embodiment, a silicon oxynitride film having a film thickness of 150 nm is formed by a plasma CVD process. Naturally, the first interlayer insulating film 461 is not limited to the silicon oxynitride film but other insulating film including silicon may be used as a single layer or a laminated structure.

Next, as shown by FIG. 19C, there is carried out a step of activating the impurity elements added to the respective semiconductor layers. The activating step is carried out by a thermal annealing process using a furnace annealing furnace. The thermal annealing process may be carried out in a nitrogen atmosphere having an oxygen concentration equal to or smaller than 1 ppm, preferably, equal to or smaller than 0.1 ppm at 400 through 700° C. representatively, 500 through 550° C. and in this embodiment, the activation processing is carried out by a heat treatment at 550° C. for 4 hours. Further, other than the thermal annealing process, a laser annealing process or a rapid thermal annealing process (RTA process) is applicable.

Further, in this embodiment, when the thermal crystallization is also applied using nickel or the like as a catalyst in the crystallizing step, the metal elements crystallized impurity regions 423*a*, 425*a*, 426*a*, 446*a* and 447*a* including a high concentration of phosphorus simultaneously with the activation processing. Therefore above-mentioned metal elements are gettered by the above mentioned impurity elements and a metal element concentration in the semiconductor layer mainly constituting a channel-forming region is reduced. According to TFT having the channel forming region fabricated in this way, the off current value is reduced, crystalline performance is excellent and therefore, there is provided high field effect mobility and excellent electric properties can be achieved.

Further, the heat treatment may be carried out prior to forming the first interlayer insulating film. However, when a wiring material used is weak at heat, it is preferable to carry out the activation processing after forming the interlayer insulating film (insulating film whose major component is silicon, for example, silicon nitride film) for protecting wirings as in this embodiment.

Further, there is carried out a step of hydrogenating the semiconductor layer by carrying out a heat treatment in an atmosphere including 3 to 100% of hydrogen at 300 to 550° C. for 1 through 12 hours. In this embodiment, there is carried out a heat treatment in a nitrogen atmosphere including about 3% of hydrogen at 410° C. for 1 hour. The step is a step of terminating dangling bond of the semiconductor layer by hydrogen included in the interlayer insulating film. As other means of hydrogenation, there may be carried out plasma hydrogenation (using hydrogen excited by plasma).

Further, when a laser annealing process is used as an activation processing, it is preferable to irradiate laser beam of YAG laser or the like after carrying out the hydrogenation.

Next, there is formed a second interlayer insulating film 462 comprising an inorganic insulating material or an organic insulating material above the first interlayer insulating film 461. In this embodiment, there is formed a acrylic resin film having film thickness of 1.6 μm and there is used a film having a viscosity of 10 to 1000 cp, preferably, 40 through 200 cp and formed with projections and recesses at a surface thereof.

In this embodiment, in order to prevent the mirror reflection, projection and recess portions are formed on the surfaces of the pixel electrodes by forming the second interlayer insulating film with projection and recess portions on the surface. Also, in order to attain light scattering characteristics by forming the projection and recess portions on the surfaces of the pixel electrodes, projection portions may be formed in regions below the pixel electrodes. In this case, since the same photomask is used in the formation of the TFTs, the projection portions can be formed without increasing the number of processes. Note that the projection portion may be suitably provided in the pixel portion region except for the wirings and the TFT portion on the substrate. Thus, the projection and recess portions are formed on the surfaces of the pixel electrodes along the projection and recess portions formed on the surface of the insulating film covering the projection portion.

Also, a film with the leveled surface may be used as the second interlayer insulating film 462. In this case, the following is preferred. That is, after the formation of the pixel electrodes, projection and recess portions are formed on the surface with a process using a known method such as a sandblast method or an etching method. Thus, since the mirror reflection is prevented and reflection light is scattered, whiteness is preferably increased.

Then, in a driver circuit 506, wirings 463 to 467 electrically connected with the respective impurity regions are formed. Note that those wirings are formed by patterning a lamination film of a Ti film with a film thickness of 50 nm and fin alloy film (alloy film of Al and Ti) with a film thickness of 500 nm.

Figure 20:
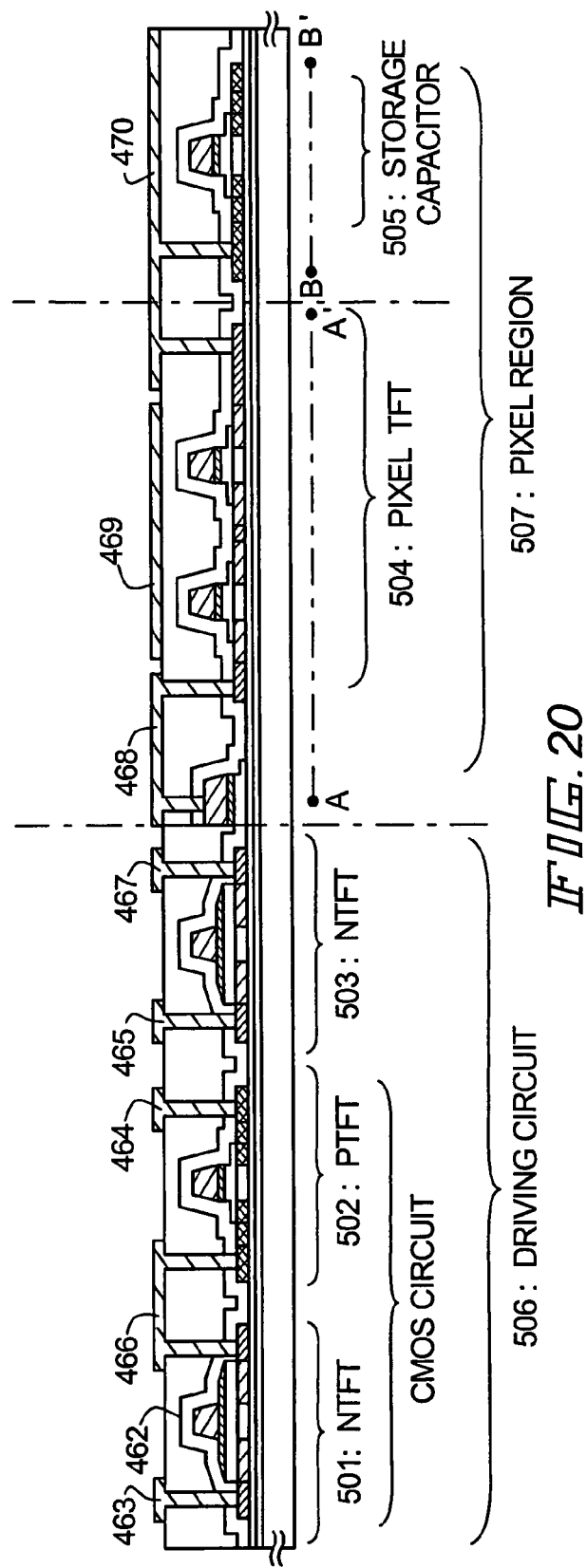
FIG. 20 is a sectional view showing a manufacturing step of the pixel TFT and the TFTs of the driving circuit.

Also, in a pixel portion 507, a pixel electrode 470, a gate wiring 469, and a connection electrode 468 are formed (FIG. 20). By this connection electrode 468, an electrical connection between a source wiring (lamination layer of the impurity region 443*b* and the first conductive layer 449) and the pixel TFT is formed. Also, an electrical connection between the gate wiring 469 and the gate electrode of the pixel TFT is formed. With respect to the pixel electrode 470, an electrical connection with the drain region 442 of the pixel TFT and an electrical connection with the semiconductor layer 458 which functions as one of electrodes for forming a storage capacitor are formed. It is desired that a material having a high reflectivity, such as a film containing Al or Ag as its main constituent, or a lamination film thereof is used for the pixel electrode 470.

Thus, the driver circuit 506 having a CMOS circuit formed by an n-channel TFT 501 and a p-channel TFT 502 and an n-channel type TFT 503, and the pixel portion 507 having a pixel TFT 504 and a retaining capacitor 505 can be formed on the same substrate. As a result, the active matrix substrate is completed.

The n-channel type TFT 501 of the driver circuit 506 has a channel forming region 423*c*, a low concentration impurity region (GOLD region) 423*b* overlapping with the first conductive layer 428*a* constituting a portion of the gate electrode, and a high concentration impurity region 423*a* which functions as the source region or the drain region. The p-channel type TFT 502 forming the CMOS circuit by connecting with the n-channel type TFT 501 through an electrode 466 has a channel forming region 446*d*, an impurity region 446*b*, 446*c* formed outside the gate electrode, and a high concentration impurity region 446*a* which functions as the source region or the drain region. The n-channel type TFT 503 has a channel forming no region 425*c*, a low concentration impurity region 425*b* (GOLD region) overlapping with the first conductive layer 430*a* comprising a part of the gate electrode, and a high concentration impurity region 425*a* which functions as the source region or the drain region.

The pixel TFT 504 of the pixel portion includes a channel forming region 426*c*, a low concentration impurity region 426*b* (LDD region) formed outside the gate electrode, and the high concentration impurity region 426*a* functioning as a source region or a drain region. Besides, impurity elements imparting p-type conductivity are added to the respective semiconductor layers 447*a*, 447*b* functioning as one of the electrodes of the storage capacitor 505. The storage capacitor 505 is formed from the electrode (a lamination of 438a and 438b) and the semiconductor layers 447a to 447c using the insulating film 444 as a dielectric member.

Further, in the pixel structure of this embodiment, an end portion of the pixel electrode is formed by arranging it so as to overlap with the source wiring so that the gap between the pixel electrodes is shielded from light without using a black matrix.

Figure 21:
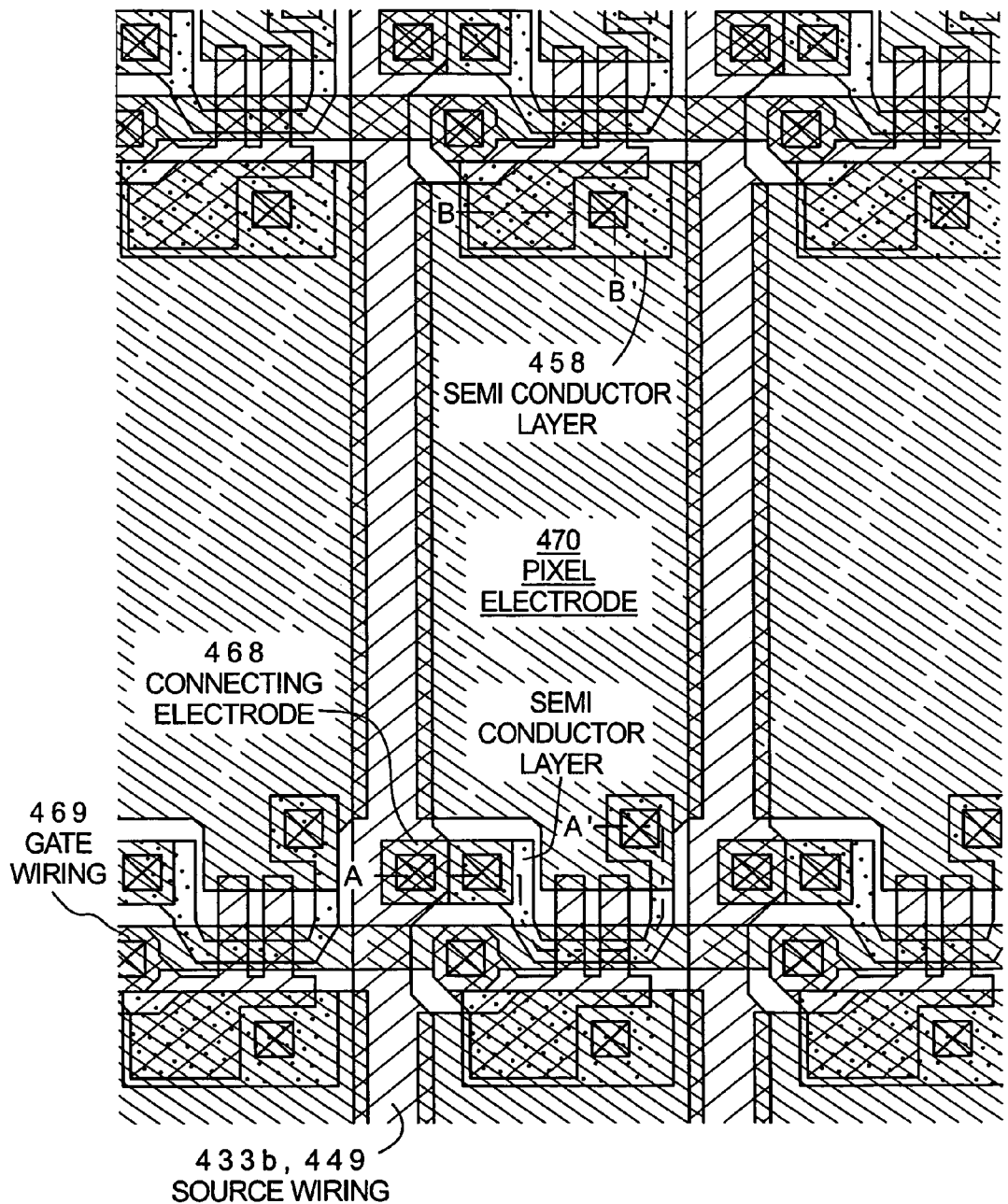
FIG. 21 is a top view showing a structure of a pixel TFT.

A top view of the pixel portion of the active matrix substrate manufactured in this embodiment is shown in FIG. 21, Note that, the same reference numerals are used to indicate parts corresponding FIGS. 17 to 20. A dash line A-A' in FIG. 20 corresponds to a sectional view taken along the line A-A' in FIG. 21. Also, a dash line B-B' in FIG. 20 corresponds to a sectional view taken along the line B-B' in FIG. 21.

This embodiment can be performed by freely combining with the embodiments 1 to 4.

Embodiment 6

Figure 22:
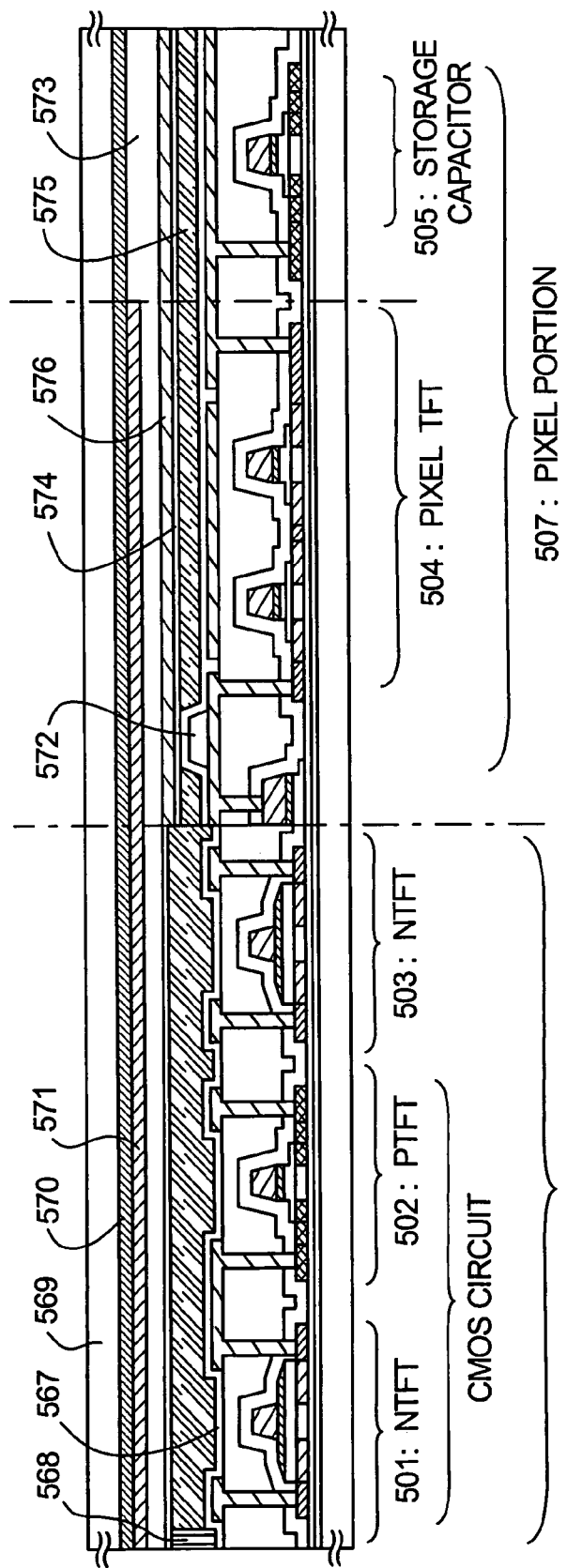
FIG. 22 is a sectional view showing a manufacturing step of an active matrix type liquid crystal display device.

In this embodiment, an explanation will be given as follows of steps of fabricating a reflection type liquid crystal display device from the active matrix substrate fabricated in the embodiment 5. FIG. 22 is used in the explanation.

First, in accordance with the embodiment 5, there is provided the active matrix substrate in the state of FIG. 20 and thereafter, an alignment film 567 is formed above the active matrix substrate of FIG. 20, at least above the pixel electrode 470 and a rubbing processing is carried out. Further, in this embodiment, before forming the alignment film 567, by patterning an organic resin film such as an acrylic resin film, spacers in a columnar shape 572 are formed at desired positions in order to maintain an interval between substrates. Further, in place of the spacers in the columnar shape, spacers in a spherical shape may be scattered over an entire face of the substrate.

Next, an opposed substrate 569 is prepared. Successively, there are formed color layers 570 and 571 and a leveling film 573. A light shielding portion is formed by overlapping the color layer 570 of red color and the color layer 572 of blue color. Further, the light shielding portion may be formed by overlapping portions of a color layer of red color and a color layer of green color.

In this embodiment, there is used the substrate shown in the embodiment 4. Therefore, in FIG. 21 showing the top view of the pixel portion of the embodiment 4, it is necessary to shield at least a gap between the gate wiring 469 and the pixel electrode 470, a gap between the gate wiring 469 and the connection electrode 468 and a gap between the connection electrode 468 and the pixel electrode 470. In this embodiment, the respective color layers are arranged such that the light shielding portions constituted by laminating the color layers overlap positions to be shielded and the opposed substrate is pasted thereto.

A number of steps can be reduced by shielding the gaps among the respective pixels by the light shielding portions constituted by laminating the color layers in this way without forming light shielding layers such as black masks.

Next, the opposed electrode 576 constituted by a transparent conductive film is formed on the leveling film 573 at least at the pixel portion, an alignment film 574 is formed over an entire face of the opposed substrate and the rubbing processing is carried out.

Further, the active matrix substrate formed with the pixel portion and the drive circuit and the opposed substrate are pasted together by seal member 568. The seal member 568 is mixed with fillers, and the two substrates are pasted together at a uniform interval therebetween by the tillers and columnar shape spacers. Thereafter, the interval between the two substrates is injected with a liquid crystal material 575 and is completely sealed by a seal agent (not illustrated). A well-known liquid crystal material may be used for the liquid crystal material 575. In this way, the reflection type liquid crystal display apparatus shown in FIG. 22 is finished. Further, as necessary, the active matrix substrate or the opposed substrate may be divided into a desired shape. Further, a polarizer (not illustrated) is pasted to only the opposed substrate. Further, FPC is pasted thereto by using well-known technology.

Thus formed liquid crystal display device have a TFT formed by using the semiconductor film on which large size crystal grains are formed, and enough operation characteristics and reliability can be realized. The liquid crystal display device fabricated in this way can be used as display portions of various electronic apparatus.

This embodiment can be performed by freely combining with the embodiments 1 to 5.

Embodiment 7

Figure 23:
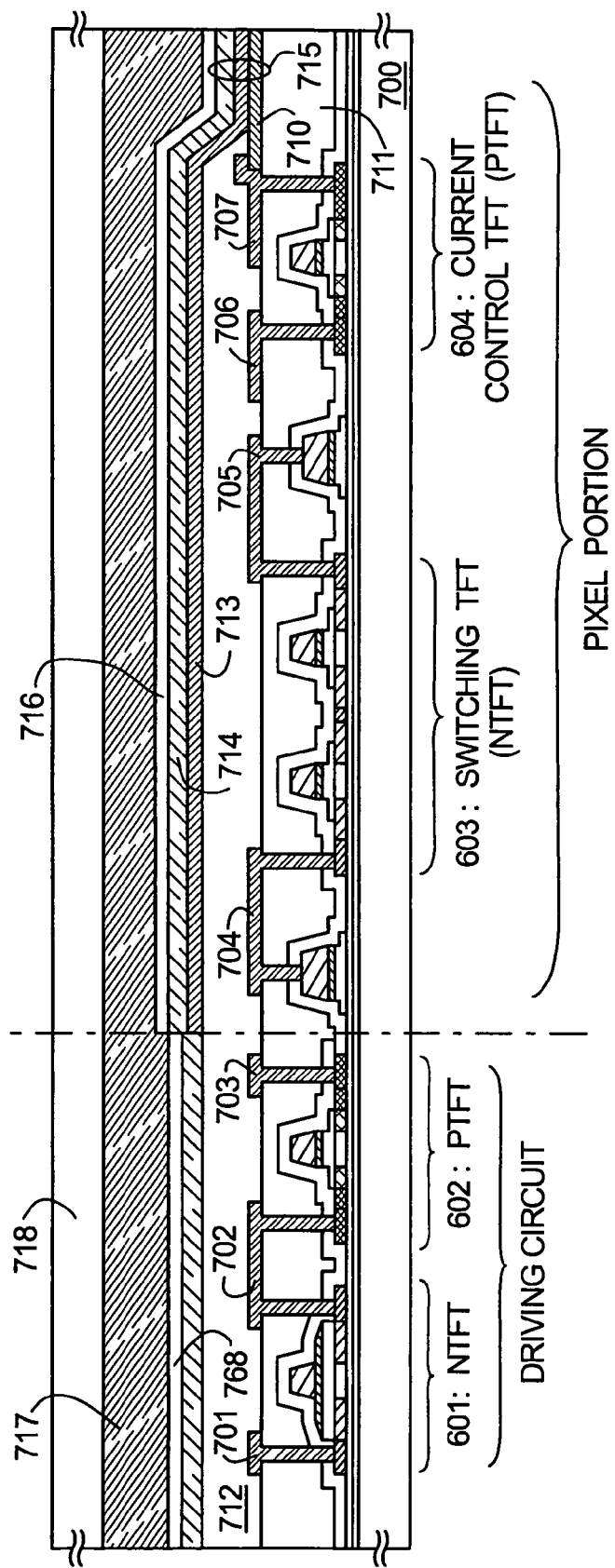
FIG. 23 is a sectional structural view of a driving circuit and a pixel portion of a light-emitting device.

In this embodiment, a description will be given of an example in which an EL (Electro Luminescence) display device is manufactured as a light-emitting device by using a manufacturing method of a TFT in manufacturing an active matrix substrate as described in the embodiment 5. The EL display device is a light-emitting device including, as a light source, a layer (EL element) containing an organic compound in which luminescence is obtained by application of an electric field. The EL of the organic compound includes light emission (fluorescence) obtained when a singlet excited state is returned to a ground state, and light emission (phosphorescence) obtained when a triplet excited state is returned to the ground state. FIG. 23 is a sectional view of a light emitting device of this embodiment.

Incidentally, in the present specification, any layers formed between an anode and a cathode in a light-emitting element are defined as organic light-emitting layers. Specifically, the organic light-emitting layer includes a light-emitting layer, a hole injection layer, an electron injection layer, a hole transport layer, an electron transport layer, and the like. Basically, the light-emitting element has a structure in which all anode layer, a light-emitting layer, and a cathode layer are stacked in sequence, and in addition to this structure, the light-emitting layer may have a structure in which an anode layer, a hole injection layer, a light-emitting layer and a cathode layer, or an anode layer, a hole injection layer, a light-emitting layer, an electron transport layer, and a cathode layer are stacked in sequence.

In FIG. 23, a switching TFT 603 provided on a substrate 700 is formed by using the n-channel TFT 503 of FIG. 22. Accordingly, the description of the n-channel TFT 503 may be referred to for a description of its structure.

Incidentally, in this embodiment, although a double gate structure in which two channel formation regions are formed is adopted, a single gate structure in which one channel formation region is formed or a triple gate structure in which three channel formation regions are formed may be adopted.

A driving circuit provided on the substrate 700 is formed by using the CMOS circuit of FIG. 22. Accordingly, the description of the n-channel TFT 501 and the p-channel TFT 502 may be referred to for a description of its structure.

Although this embodiment adopts the single gate structure, the double gate structure or the triple gate structure may be adopted.

Besides, wiring lines 701 and 703 function as source wiring lines of the CMOS circuit, and a wiring line 702 functions as a drain wiring line. A wiring line 704 functions as a wiring line for electrically connecting a source wiring line 708 and a source region of the switching TFT, and a wiring line 705 functions as a wiring line for electrically connecting a drain wiring line 709 and a drain region of the switching TFT.

Incidentally, a current control TFT 604 is formed by using the p-channel TFT 502 of FIG. 22. Accordingly, the description of the p-channel TFT 502 may be referred to for a description of its structure. Incidentally, although this embodiment adopts the single gate structure, the double gate structure or the triple gate structure may be adopted.

A wiring line 706 is a source wiring line (equivalent to a current supply line) of the current control TFT, and a wiring line 707 is an electrode which overlaps with a pixel electrode 710 of the current control TFT so that it is electrically connected to the pixel electrode 710.

Incidentally, reference numeral 710 designates the pixel electrode (anode of an EL element) made of a transparent conductive film. As the transparent conductive film, a compound of indium oxide and tin oxide, a compound of indium oxide and zinc oxide, zinc oxide, tin oxide or indium oxide can be used. The transparent conductive film added with gallium may be used. The pixel electrode 710 is formed on a flat interlayer insulating film 711 before the writing lines are formed. In this embodiment, it is very important to flatten stepped portions due to the TFTs by using the leveling film 711 made of resin. Since an EL layer formed later is very thin. There is a case where poor light emission occurs due to the existence of the stepped portions. Accordingly, it is desirable to perform flattening before the pixel electrode is formed so that the EL layer can be formed on the flattest possible surface.

After the wiring lines 701 to 707 are formed, as shown in FIG. 23, a bank 712 is formed. The bank 712 may be formed by patterning an insulating film having a thickness of 100 to 400 nm and containing silicon or an organic resin film.

Incidentally, since the bank 712 is the insulating film, it is necessary to be cautious about electro-static damage of the element at the time of film growth. In this embodiment, carbon particles or metal particles are added in the insulating film as the material of the bank 712 to lower the resistivity and to suppress the generation of static electricity. At this time, it is appropriate that the addition amount of the carbon particle or the metal particle is adjusted so that the resistivity becomes $1\times10^6$ to $1\times10^{12}$ Ωm (preferably $1\times10^8$ to $1\times10^{10}$ Ωm).

An EL layer 713 is formed on the pixel electrode 710. Incidentally, although only one pixel is shown in FIG. 23, in this embodiment. EL layers corresponding to R (red), G (green) and B (blue) are separately formed. Besides, in this embodiment, a low molecular organic EL material is formed by an evaporation method. Specifically, a laminate structure is adopted in which a copper phthalocyanine (CuPc) film having a thickness of 20 nm is provided as a hole injection layer, and a tris-8-quinolinolato aluminum complex (Alq$_3$) film having a thickness of 70 nm is provided thereon as a light-emitting layer. The color of light emission can be controlled by adding a fluorescent pigment, such as quinacridone, perylene or DCM1, to Alq$_3$.

However, the above example is an example of the organic EL material which can be used for the EL layer, and it is not necessary to limit the invention to this. A light-emitting layer, a charge transport layer and a charge injection layer may be freely combined to form an EL layer (layer for light emission and movement of carriers for that). For example, although this embodiment shows the example in which the low molecular organic EL material is used for the EL layer, a high molecular or organic EL material may be used. Besides, an inorganic material such as silicon carbide can also be used for the charge transport layer or the charge injection layer. A well-known material can be used as the organic EL material or the inorganic material.

Next, a cathode 714 made of a conductive film is provided on the EL layer 713. In the case of this embodiment, an alloy film of aluminum and lithium is used as the conductive film. Of course, a well-known MgAg film (alloy film of magnesium and silver) may be used. As the cathode material, a conductive film made of elements in group 1 or group 2 of the periodic table or a conductive film added with those elements may be used.

An EL element 715 is completed at the point of time when the portions up to this cathode 714 are formed. Incidentally, the EL element 715 here indicates a diode formed of the pixel electrode (anode) 710, the EL layer 713, and the cathode 714.

It is effective to provide a passivation film 716 so as to completely cover the EL element 715. The passivation film 716 is made of an insulating film containing a carbon film, a silicon nitride film, or a silicon nitride oxide film, and a single layer of the insulating film or a laminate layer of a combination of those films is used.

At this time, it is preferable to use a film excellent in coverage as the passivation film, and it is effective to use a carbon film, especially a DLC (diamond-like carbon) film. Since the DLC film can be formed in the temperature range of from room temperature to 100° C., it can be easily formed over the EL layer 713 which has low heat resistance. Besides, the DLC film has a high blocking effect against oxygen, and can suppress oxidation of the EL layer 713. Thus, it is possible to prevent such a problem that the EL layer 713 is oxidized during a period when a sealing step subsequent to this is performed.

Further, a sealing member 717 is provided on the passivation film 716, and a cover member 718 is bonded. An ultraviolet ray curing resin may be used for the sealing member 717, and it is effective to provide a material having a moisture absorption effect or a material having an anti-oxidation effect in its inside. Besides, in this embodiment, what is obtained by forming carbon films (preferably diamond-like carbon films) on both surfaces of a glass substrate, a quartz substrate or a plastic substrate (including a plastic film) is used as the cover member 718.

In this way, the light-emitting device having the structure as shown in FIG. 23 is completed. Incidentally, it is effective that the steps from the completion of the bank 712 to the formation of the passivation film 716 are continuously performed by using a multi-chamber system (or an inline system) film forming apparatus and without exposing to the air. Moreover, it is also possible to continuously perform the steps Lip to the step of bonding the cover member 718 without exposing to the air.

In this way, n-channel TFTs 601 and 602, the switching TFT (n-channel TFT) 603, and the current control TFT (n-channel TFT) 604 are formed on the insulator 700 using a plastic substrate as a parent substance. The number of masks required in the manufacturing process up to this is smaller than that of a general active matrix type light-emitting device.

That is, the manufacturing process of the TFT is greatly simplified, and the improvement of yield and the reduction of manufacturing costs can be realized.

Further, as described with reference to FIG. 23, by providing the impurity region overlapping with the gate electrode through the insulating film, the n-channel TFT having high resistance against deterioration due to a hot carrier effect can be formed. Thus, a highly reliable light-emitting device can be realized.

Besides, in this embodiment, although only the structure of the pixel portion and the driving circuit is shown, according to the manufacturing process of this embodiment, in addition to those, a signal dividing circuit, a D/A converter, an operational amplifier, and a logical circuit such as a γ-correction circuit can be formed on the same insulator, and further, a memory and a microprocessor can also be formed.

Further, the EL light-emitting device of this embodiment after the steps up to the sealing (or encapsulating) step for protecting the EL element are performed, will be described with reference to FIGS. 24A and 24B. Incidentally, as the need arises, reference numerals used in FIG. 23 are referred to.

FIG. 24A is a top view showing a state where the steps up to the seating of the EL element are performed, and FIG. 24B is a sectional view taken along line C-C' of FIG. 24A. Reference numeral 801 of a portion indicated by a dotted line designates a source side driving circuit: 806, a pixel portion; and 807, a gate side driving circuit. Besides, reference numeral 901 designates a cover member: 902, a first seal member: and 903, a second seal member, and a sealing member 907 is provided in the inside surrounded by the first seal member 902.

Incidentally, reference numeral 904 designates a wiring line for transmitting a signal inputted to the source side driving circuit 801 and the gate side driving circuit 807, which receives a video signal and a clock signal from an FPC (Flexible Printed Circuit) 905 as an external input terminal. Incidentally, here, although only the FPC is shown, a printed wiring board (PWB) may be fixed to the FPC. The light-emitting device in the present specification includes not only the body of the light-emitting device, but also a state where the FPC or the PWB is fixed to that.

Next, a sectional structure will be described with reference to FIG. 24B. The pixel portion 806 and the gate side driving circuit 807 are formed over the substrate 700, and the pixel portion 806 is formed of a plurality of pixels each including a current control TFT 604 and a pixel electrode 710 electrically connected to its drain. The gate side driving circuit 807 is formed by using a CMOS circuit (see FIG. 14) in which an n-channel TFT 601 and a p-channel TFT 602 are combined.

The pixel electrode 710 functions as an anode of the EL element. Banks 712 are formed at both ends of the pixel electrode 710, and an EL layer 713 and a cathode 714 of the EL element are formed on the pixel electrode 710.

The cathode 714 functions also as a wiring line common to all the pixels, and is electrically connected to the FPC 905 through the connection wiring line 904. Further, all elements included in the pixel portion 806 and the gate side driving circuit 807 are covered with the cathode 714 and the passivation film 716.

Besides, the cover member 901 is bonded by the first seal member 902. Incidentally, a spacer made of a resin film may be provided to ensure an interval between the cover member 901 and the EL element. The sealing member 907 is filled in the inside of the first seal member 902. Incidentally, it is preferable to use an epoxy resin for the first seal member 902 and the sealing member 907. Besides, it is desirable that the first seal member 902 is made of a material which blocks permeation of moisture or oxygen to the utmost. Further, a material having a moisture absorption effect or an anti-oxidation effect may be contained in the inside of the sealing member 907.

The sealing member 907 provided so as to cover the EL element functions also as an adhesive for bonding the cover member 901. Besides, in this embodiment, FRP (Fiberglass-Reinforced Plastics). PVF (Polyvinyl fluoride). Mylar, polyester, or acryl can be used for a material of a plastic substrate 901a constituting the cover member 901.

Besides, after the cover member 901 is bonded by using the sealing member 907, the second seal member 903 is provided so as to cover the side surface (exposed surface) of the sealing member 907. The same material as the first seal member 902 can be used for the second seal member 903.

By sealing the EL element in the sealing member 907 through the structure as described above, the EL element can be completely isolated from the outside, and it is possible to prevent a material to accelerate the deterioration by oxidation of the EL layer, such as moisture or oxygen, from invading from the outside. According, a highly reliable light-emitting device can be obtained.

The light-emitting device manufactured in the manner as described above includes the TFT manufactured by using the semiconductor film in Which the crystal grain of the large grain size is formed, and the operation characteristics and reliability of the light-emitting device can become sufficient, Such light-emitting devices can be used as display portions of various electronic instruments.

Incidentally, this embodiment can be freely combined with Embodiments 1 to 5.

Embodiment 8

Various semiconductor devices (active matrix type liquid crystal display device, active matrix type light-emitting device or active matrix type EC display device) can be formed by applying the present invention. Specifically, the present invention can be embodied in electronic equipment of any type in which such an electrooptical device is incorporated in a display part.

Such electronic equipment is a video camera, a digital camera, a digital camera, a projector, a head-mounted display (goggle type display), a car navigation system, a car stereo, a personal computer, or a mobile information terminal (such as a mobile computer, a mobile telephone or an electronic book). FIGS. 25A-25F, 26A-26D, and 27A-27C show one of its examples.

Figure 25A:
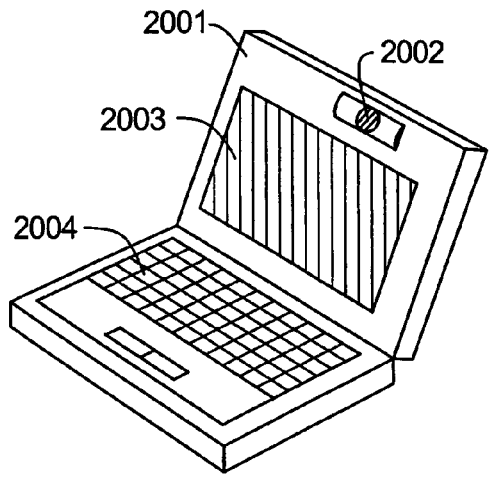
FIGS. 25A to 25F are views showing examples of semiconductor devices.

FIG. 25A shows a personal computer which includes a body 2001, an image input part 2002, a display part 2003, a keyboard 2004 and the like. The invention can be applied to the display part 2003.

Figure 25B:
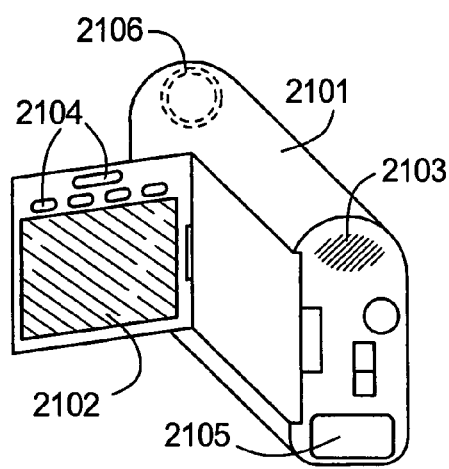

FIG. 25B shows a video camera which includes a body 2101, a display part 2102, a sound input part 2103, operating switches 2104, a battery 2105, an image receiving part 2106 and the like. The invention can be applied to the display part 2102.

Figure 25C:
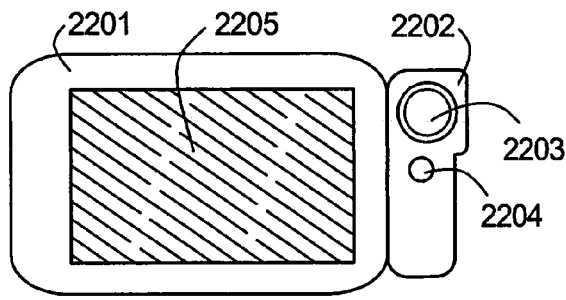

FIG. 25C shows a mobile computer which includes a body 2201, a cameral part 2202, an image receiving part 2203, an operating switch 2204, a display part 2205 and the like. The invention can be applied to the display part 2205.

Figure 25D:
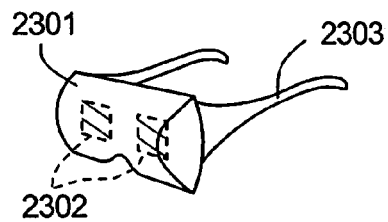

FIG. 25D shows a goggle type display which includes a body 2301, a display part 2302, arm parts 2303 and the like. The invention can be applied to the display part 2302.

Figure 25E:
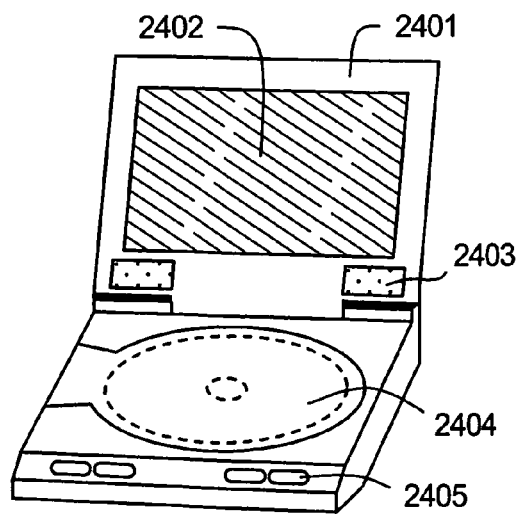

FIG. 25E shows a player using a recording medium on which a program is recorded (hereinafter referred to as the recording medium), and the player includes a body 2401, a display part 2402, speaker parts 2403, a recording medium 2404, operating switches 2405 and the like. This player uses a DVD (Digital Versatile Disc), a CD and the like as the recording medium, and enables a user to enjoy music, movies games and the Internet. The invention can be applied to the display part 2402.

Figure 25F:
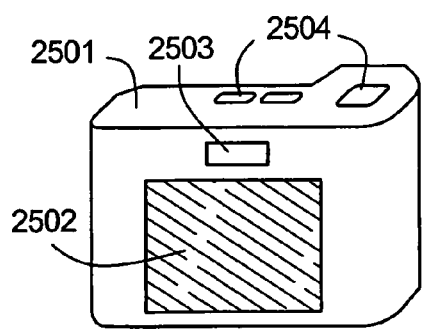

FIG. 25F shows a digital camera which includes a body 2501, a display part 2502, an eyepiece part 2503, operating switches 2504, an image receiving part (not shown) and the like. The invention can be applied to the display part 2502.

Figure 26A:
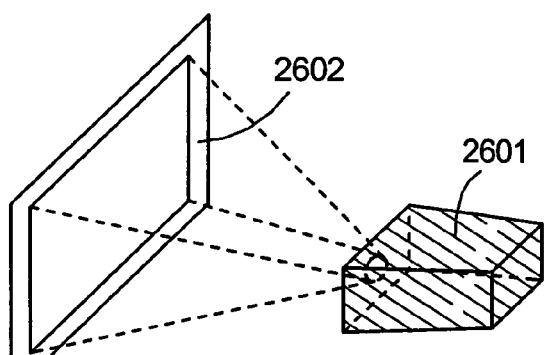
FIGS. 26A to 26D are views showing examples of semiconductor devices.

FIG. 26A shows a front type projector which includes a projection device 2601, a screen 2602 and the like. The invention can be applied to a liquid crystal display device 2808 which constitutes part of the projection device 2601 as well as other driver circuits.

Figure 26B:
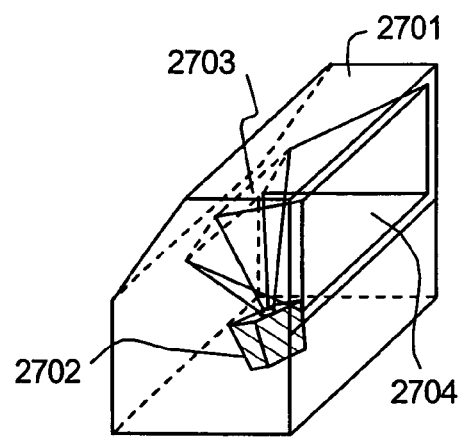

FIG. 26B shows a rear type projector which includes a body 2701, a projection device 2702, a mirror 2703, a screen 2704 and the like. The invention can be applied to the liquid crystal display device 2808 which constitutes part of the projection device 2702 as well as other driver circuits.

Figure 26C:
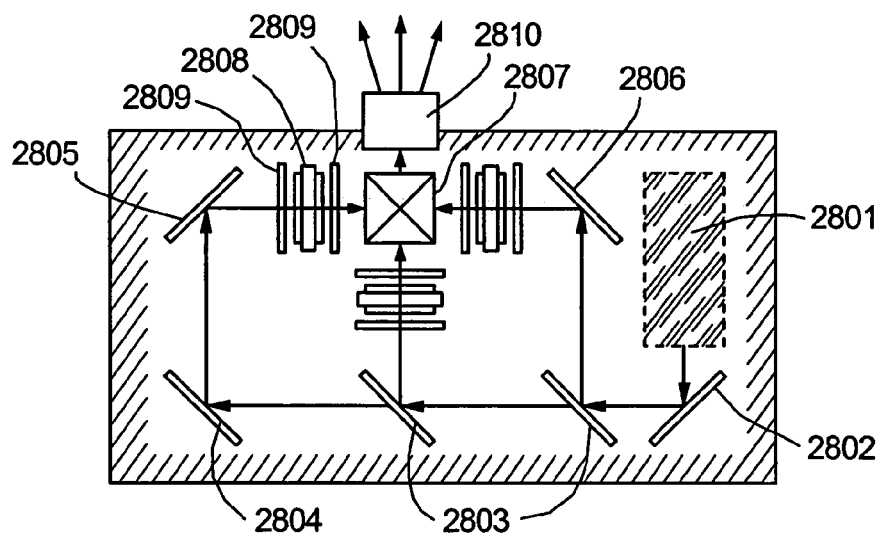

FIG. 26C shows one example of the structure of each of the projection devices 2601 and 2702 which are respectively shown in FIGS. 26A and 26B. Each of the projection devices 2601 and 2702 is made of a light source optical system 2801, mirrors 2802 and 2804-2806, a dichroic mirror 2803, a prism 2807, a liquid crystal display device 2808, a phase difference plate 2809 and a projection optical system 2810. The projection optical system 2810 is made of an optical system including a projection lens. The embodiment 8 is an example of a three-plate type, but it is not limited to this example and may also be of a single-plate type. In addition, those who embody the invention may appropriately dispose an optical system such as an optical lens, a film having a polarization function, a film for adjusting phase difference or an IR film in the path indicated by arrows in FIG. 26C.

Figure 26D:
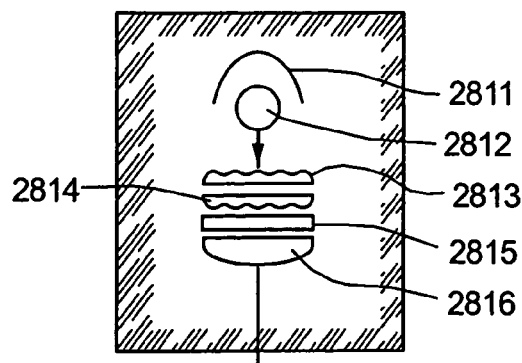

FIG. 26D is a view showing one example of the structure of the light source optical system 2801 shown in FIG. 26C. In the embodiment 8, the light source optical system 2801 is made of a reflector 2811, a light source 2812, lens arrays 2813 and 2814, a polarizing conversion element 2815 and a condenser lens 2816. Incidentally, the light source optical system shown in FIG. 26D is one example, and the invention is not particularly limited to the shown construction. For example, those whose embody the invention may appropriately dispose an optical system such as an optical lens, a film having a polarization function, a film for adjusting phase difference or an IR film.

The projector shown in FIGS. 26A to 26D is of the type using a transparent type of electrooptical device, but there is not shown an example in Which the invention is applied to a reflection type of electrooptical device and a light-emitting device.

Figure 27A:
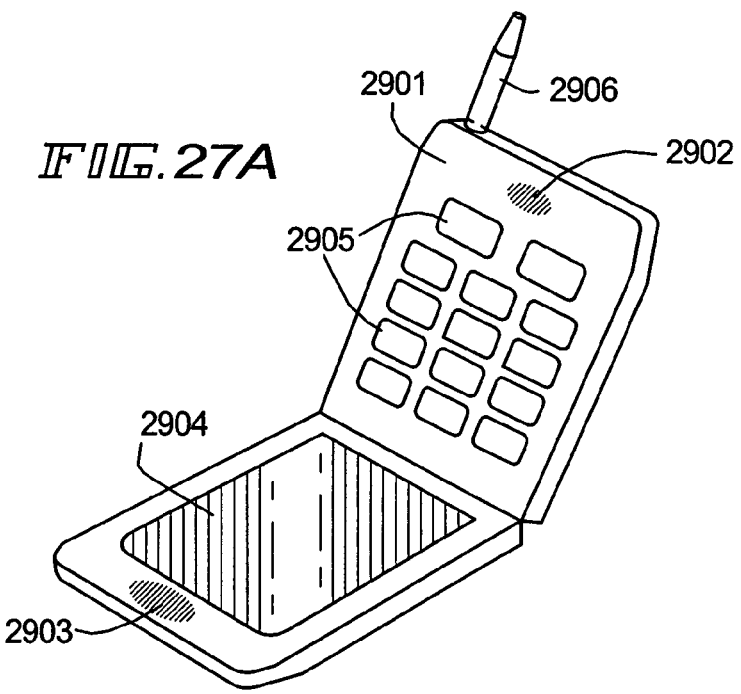
FIGS. 27A to 27C are views showing examples of semiconductor devices.

FIG. 27A shows a mobile telephone which includes a body 2901, a sound output part 2902, a sound input part 2903, a display part 2904, operating switches 2905, an antenna 2906 and the like. The invention can be applied to the display part 2904.

Figure 27B:
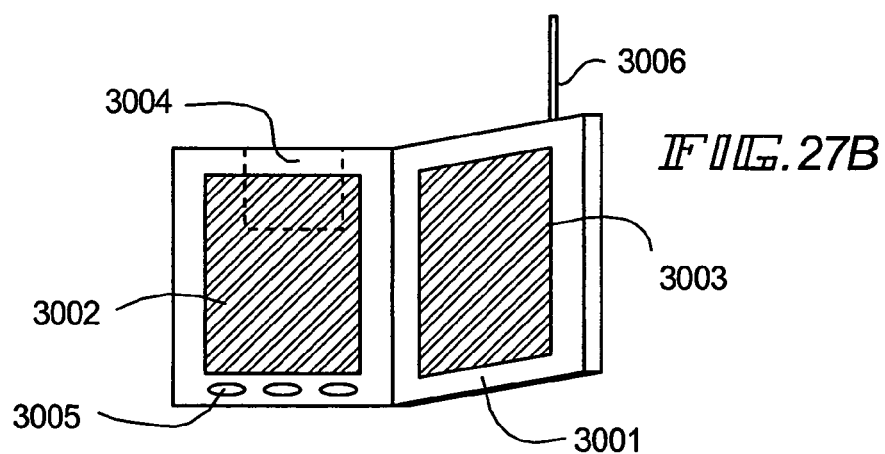

FIG. 27B shows a mobile book (electronic book) which includes body 3001, display parts 3002 and 3003, a storage medium 3004, operating switches 3005, an antenna 3006 and the like. The invention can be applied to the display parts 3002 and 3003.

Figure 27C:
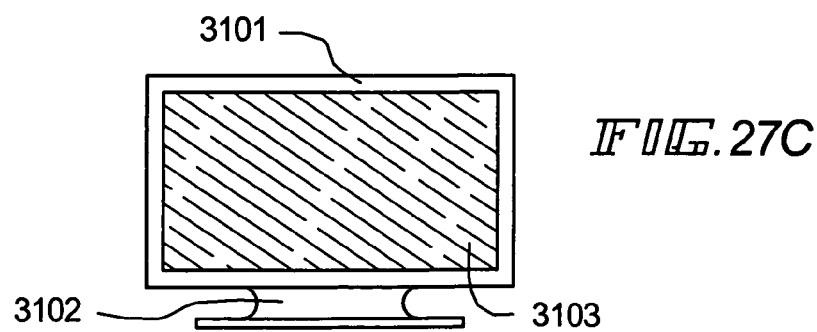
Figure 28:
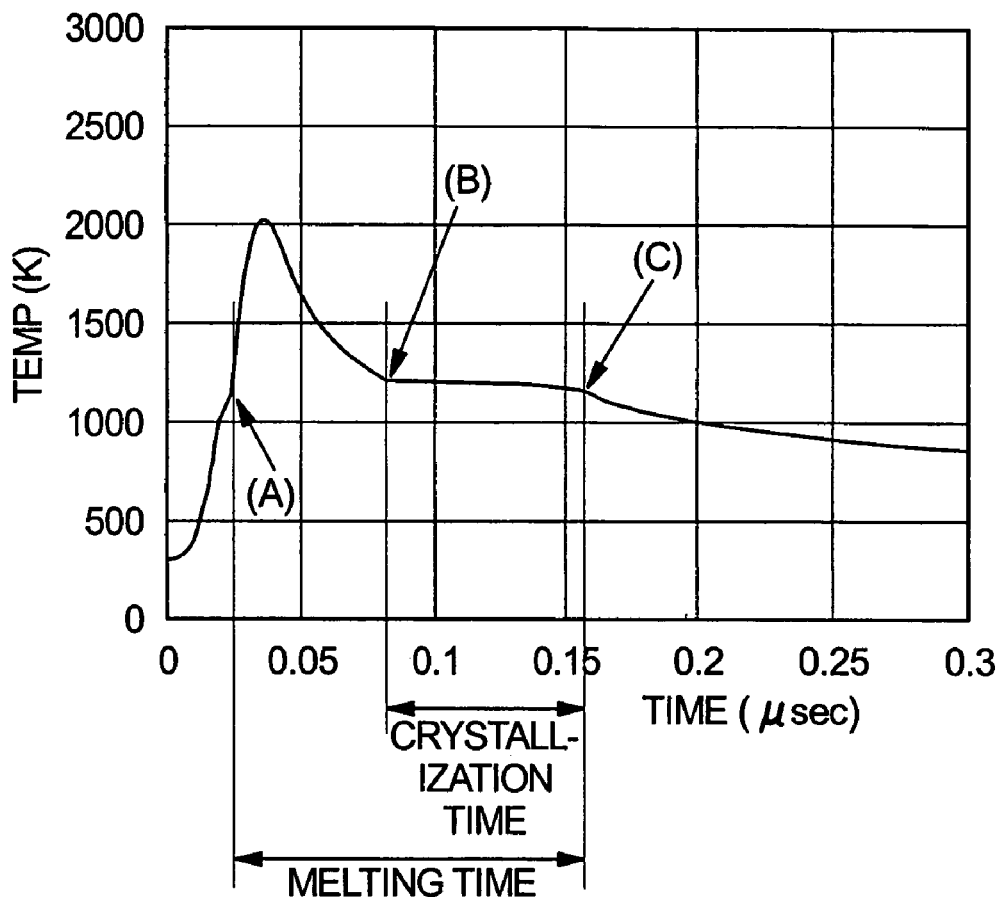
FIG. 28 is a view for explaining a melting time and a crystallization time.

FIG. 27C shows a display which includes a body 3101, a support base 3102, a display part 3103 and the like. The invention can be applied to the display part 3103. The invention is particularly advantageous to a large-screen display, and is advantageous to a display having a diagonal size of 10 inches or more particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of the embodiments 1 to 7.

According to the present invention, at the laser annealing, a laser beam is formed into a linear shape to improve throughput, and further, a solid laser easy to maintain is used, so that the improvement of the throughput can be achieved as compared with a conventional laser annealing using an excimer laser. Thus, the manufacturing costs of a semiconductor device, such as a TFT or a liquid crystal display device formed of TFTs, can be reduced.

Moreover, by performing a laser annealing through such a scheme that laser beams provided with a time difference between them are irradiated to a semiconductor film, it is possible to obtain a crystalline semiconductor film having a crystal grain of a grain size equivalent to or larger than a conventional size (in a case where an excimer laser beam is irradiated). By obtaining the crystalline semiconductor film having the large crystal grain size, the performance of the semiconductor device can be greatly improved.

What is claimed is:

1. A method of manufacturing a semiconductor device, comprising the steps of:

dividing a laser beam from a pulse oscillation type solid laser as a light source into a plurality of laser beams by using a first thin film polarizer;

changing an optical path length of at least one laser beam of the plurality of laser beams;

synthesizing the plurality of laser beams by using a second thin film polarizer;

reflecting the synthesized laser beam by a first mirror and a second mirror without further dividing the synthesized laser beam; and irradiating a semiconductor film with the synthesized and reflected laser beam.

2. A method according to claim 1, wherein the laser beam is divided into an s-component and a p-component to form the plurality of laser beams.

3. A method according to claim 1, wherein an output time of the laser beam is 1 to 50 ns.

4. A method according to claim 1, wherein the pulse oscillation type solid laser is one selected from the group consisting of a YAG laser, a YVO$_4$ laser, a YLF laser, a YAlO$_3$ laser, a glass laser, a ruby laser, an alexandrite laser, and a Ti:sapphire laser.

5. A method according to claim 1, wherein the semiconductor film is a film containing silicon.

6. A method according to claim 1, wherein said semiconductor device comprises at least one electric equipment selected from the group consisting of a video camera, a digital camera, a projector, a head-mounted display, a goggle type display, a car navigation system, a car stereo, a personal computer, a mobile information terminal, a mobile computer, a mobile telephone, and an electronic book.

7. A method of manufacturing a semiconductor device, comprising the steps of:

reflecting a laser beam from a pulse oscillation type solid laser as a light source by at least one first mirror;

dividing the laser beam into a plurality of laser beams by using a first thin film polarizer;

changing an optical path length of at least one laser beam of the plurality of laser beams;

synthesizing the plurality of laser beams by using a second thin film polarizer;

reflecting the synthesized laser beam by a second mirror and a third mirror without further dividing the synthesized laser beam; and irradiating a semiconductor film with the synthesized and reflected laser beam.

8. A method according to claim 7, wherein the laser beam is divided into an s-component and a p-component to form the plurality of laser beams.

9. A method according to claim 7, wherein an output time of the laser beam is 1 to 50 ns.

10. A method according to claim 7, wherein the pulse oscillation type solid laser is one selected from the group consisting of a YAG laser, a YVO$_4$ laser, a YLF laser, a YAlO$_3$ laser, a glass laser, a ruby laser, an alexandrite laser, and a Ti:sapphire laser.

11. A method according to claim 7, wherein the semiconductor film is a film containing silicon.

12. A method according to claim 7, wherein said semiconductor device comprises at least one electric equipment selected from the group consisting of a video camera, a digital camera, a projector, a head-mounted display, a goggle type display, a car navigation system, a car stereo, a personal computer, a mobile information terminal, a mobile computer, a mobile telephone, and an electronic book.

13. A method of manufacturing a semiconductor device, comprising the steps of:
dividing a laser beam from a pulse oscillation type solid laser as a light source into a plurality of laser beams by using a first thin film polarizer;
changing an optical path length of at least one laser beam of the plurality of laser beams;
synthesizing the plurality of laser beams by using a second thin film polarizer;
reflecting the synthesized laser beam by a first mirror and a second mirror without further dividing the synthesized laser beam;
forming the synthesized laser beam into a linear shape; and
irradiating a semiconductor film with the laser beam having the linear shape.

14. A method according to claim 13, wherein the laser beam is divided into an s-component and a p-component to form the plurality of laser beams.

15. A method according to claim 13, wherein an output time of the laser beam is 1 to 50 ns.

16. A method according to claim 13, wherein the pulse oscillation type solid laser is one selected from the group consisting of a YAG laser, a YVO$_4$ laser, a YLF laser, a YAlO$_3$ laser, a glass laser, a ruby laser, an alexandrite laser, and a Ti:sapphire laser.

17. A method according to claim 13, wherein the semiconductor film is a film containing silicon.

18. A method according to claim 13, wherein said semiconductor device comprises at least one electric equipment selected from the group consisting of a video camera, a digital camera, a projector, a head-mounted display, a goggle type display, a car navigation system, a car stereo, a personal computer, a mobile information terminal, a mobile computer, a mobile telephone, and an electronic book.

19. A method of manufacturing a semiconductor device, comprising the steps of:
dividing a laser beam from a pulse oscillation type solid laser as a light source into a plurality of laser beams by using a first thin film polarizer;
changing an optical path length of at least one laser beam of the plurality of laser beams by at least one first mirror;
synthesizing the plurality of laser beams by using a second thin film polarizer;
reflecting the synthesized laser beam by a second mirror and a third mirror without further dividing the synthesized laser beam; and
irradiating a semiconductor film with the synthesized and reflected laser beam.

20. A method according to claim 19, wherein the laser beam is divided into an s-component and a p-component to form the plurality of laser beams.

21. A method according to claim 19, wherein an output time of the laser beam is 1 to 50 ns.

22. A method according to claim 19, wherein the pulse oscillation type solid laser is one selected from the group consisting of a YAG laser, a YVO$_4$ laser, a YLF laser, a YAlO$_3$ laser, a glass laser, a ruby laser, an alexandrite laser, and a Ti:sapphire laser.

23. A method according to claim 19, wherein the semiconductor film is a film containing silicon.

24. A method according to claim 19, wherein said semiconductor device comprises at least one electric equipment selected from the group consisting of a video camera, a digital camera, a projector, a head-mounted display, a goggle type display, a car navigation system, a car stereo, a personal computer, a mobile information terminal, a mobile computer, a mobile telephone, and an electronic book.

25. A method of manufacturing a semiconductor device, comprising the steps of:
dividing a laser beam from a pulse oscillation type solid laser as a light source into a plurality of laser beams by using a first thin film polarizer;
changing an optical path length of at least one laser beam of the plurality of laser beams by at least one first mirror;
synthesizing the plurality of laser beams by using a second thin film polarizer;
reflecting the synthesized laser beam by a second mirror and a third mirror without further dividing the synthesized laser beam;
forming the synthesized laser beam into a linear shape; and
irradiating a semiconductor film with the laser beam having the linear shape.

26. A method according to claim 25, wherein the laser beam is divided into an s-component and a p-component to form the plurality of laser beams.

27. A method according to claim 25, wherein an output time of the laser beam is 1 to 50 ns.

28. A method according to claim 25, wherein the pulse oscillation type solid laser is one selected from the group consisting of a YAG laser, a YVO$_4$ laser, a YLF laser, a YAlO$_3$ laser, a glass laser, a ruby laser, an alexandrite laser, and a Ti:sapphire laser.

29. A method according to claim 25, wherein the semiconductor film is a film containing silicon.

30. A method according to claim 25, wherein said semiconductor device comprises at least one electric equipment selected from the group consisting of a video camera, a digital camera, a projector, a head-mounted display, a goggle type display, a car navigation system, a car stereo, a personal computer, a mobile information terminal, a mobile computer, a mobile telephone, and an electronic book.

31. A method according to claim 19, wherein four mirrors are used for the first mirror.

32. A method according to claim 25, wherein four mirrors are used for the first mirror.

33. A method according to claim 1, further comprising changing an intensity distribution ratio of the laser beams by a λ/2 plate before dividing the laser beam.

34. A method according to claim 7, further comprising changing an intensity distribution ratio of the laser beams by a λ/2 plate before dividing the laser beam.

35. A method according to claim 13, further comprising changing an intensity distribution ratio of the laser beams by a λ/2 plate before dividing the laser beam.

36. A method according to claim 19, further comprising changing an intensity distribution ratio of the laser beams by a λ/2 plate before dividing the laser beam.

37. A method according to claim 25, further comprising changing an intensity distribution ratio of the laser beams by a λ/2 plate before dividing the laser beam.

38. A method according to claim 1, wherein a shutter system is provided on an optical path of the synthesized laser beam.

39. A method according to claim 7, wherein a shutter system is provided on an optical path of the synthesized laser beam.

40. A method according to claim 13, wherein a shutter system is provided on an optical path of the synthesized laser beam.

41. A method according to claim 19, wherein a shutter system is provided on an optical path of the synthesized laser beam.

42. A method according to claim 25, wherein a shutter system is provided on an optical path of the synthesized laser beam.

43. A method according to claim 17, wherein an energy monitor system is connected to the first mirror.

* * * * *

UNITED STATES PATENT AND TRADEMARK OFFICE
CERTIFICATE OF CORRECTION

| | | |
|---|---|---|
| PATENT NO. | : 7,759,181 B2 | Page 1 of 1 |
| APPLICATION NO. | : 11/154846 | |
| DATED | : July 20, 2010 | |
| INVENTOR(S) | : Koichiro Tanaka et al. | |

It is certified that error appears in the above-identified patent and that said Letters Patent is hereby corrected as shown below:

In The Specification:

Column 6, Line 62, Change "chances" to -- changes --;

Column 10, Line 64, Change "call" to -- can --;

Column 12, Line 28, Change "it" to -- if --;

Column 13, Line 9, Change "oft" to -- of --;

Column 14, Line 19, Change "a" to -- way --;

Column 15, Line 25, Change "all" to -- an --;

Column 17, Line 17, Change "chanced" to -- changed --;

Column 20, Line 21, Change "fin" to -- an --;

Column 22, Line 2, Change "tillers" to -- fillers --;

Column 22, Line 47, Change "all" to -- an --;

Column 23, Line 29, Change "writing" to -- wiring --;

Column 24, Line 57, Change "Lip" to -- up --;

Column 25, Line 21, Change "seating" to -- sealing --;

Column 26, Line 20, Change "According" to -- Accordingly --;

Column 26, Line 58, Change "cameral" to -- camera --.

Signed and Sealed this
Twenty-second Day of March, 2011

David J. Kappos
*Director of the United States Patent and Trademark Office*